(12) United States Patent
Moriya

(10) Patent No.: US 10,326,444 B2
(45) Date of Patent: Jun. 18, 2019

(54) INTEGRATED CIRCUIT DEVICE AND ELECTRONIC APPLIANCE

(71) Applicant: SEIKO EPSON CORPORATION, Tokyo (JP)

(72) Inventor: Isamu Moriya, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 22 days.

(21) Appl. No.: 14/823,600

(22) Filed: Aug. 11, 2015

(65) Prior Publication Data

US 2016/0065208 A1 Mar. 3, 2016

(30) Foreign Application Priority Data

Aug. 28, 2014 (JP) ................. 2014-174234

(51) Int. Cl.

| | | |
|---|---|---|
| B62D 5/04 | (2006.01) | |
| H02K 9/00 | (2006.01) | |
| G06F 1/16 | (2006.01) | |
| H02K 11/33 | (2016.01) | |
| H03K 17/687 | (2006.01) | |
| H02P 8/00 | (2006.01) | |
| H01L 23/528 | (2006.01) | |

(Continued)

(52) U.S. Cl.
CPC ....... *H03K 17/6871* (2013.01); *H01L 23/528* (2013.01); *H01L 27/0203* (2013.01); *H01L 27/0922* (2013.01); *H01L 29/0619* (2013.01); *H01L 29/7801* (2013.01); *H02P 8/00* (2013.01); *H01L 21/761* (2013.01); *H01L 27/0207* (2013.01); *H01L 29/0653* (2013.01); *H01L 29/1083* (2013.01); *H01L 29/1087* (2013.01); *H01L 29/7816* (2013.01); *H01L 29/7835* (2013.01); *H01L 2924/0002* (2013.01)

(58) Field of Classification Search
CPC ........ B62D 5/0406; H02K 9/00; H02K 11/33; G06F 1/1632
USPC ................... 318/696, 724; 341/152; 360/46; 180/446; 713/300
See application file for complete search history.

(56) References Cited

U.S. PATENT DOCUMENTS 5,359,212 A 10/1994 Kudou et al.
5,483,404 A * 1/1996 Nakano ................ H02P 7/04
361/18

(Continued)

FOREIGN PATENT DOCUMENTS

JP H02-50459 A 2/1990
JP 2006-140171 A 6/2006
(Continued)

*Primary Examiner* — Eduardo Colon Santana
*Assistant Examiner* — Cortez M Cook
(74) *Attorney, Agent, or Firm* — Oliff PLC

(57) ABSTRACT

An H-bridge pre-driver is configured as two blocks so as to suit the width of an H-bridge driver Tr. The two blocks are line-symmetrically placed with a bias circuit interposed therebetween. One of the pre-driver blocks is laid out as a rectangle that is long in one direction and is short in a direction perpendicular to that direction. With this configuration, the pre-driver layout area can be reduced, and the cost of IC can be reduced. Furthermore, the symmetric placement enables matching of the impedance of interconnect from the pre-driver to the driver and stabilization of properties to be achieved.

15 Claims, 13 Drawing Sheets

(51) Int. Cl.
*H01L 29/78* (2006.01)
*H01L 29/06* (2006.01)
*H01L 27/02* (2006.01)
*H01L 27/092* (2006.01)
*H01L 21/761* (2006.01)
*H01L 29/10* (2006.01)

(56) References Cited

U.S. PATENT DOCUMENTS

| | | | | |
|---|---|---|---|---|
| 5,847,521 A | * | 12/1998 | Morikawa | H02P 6/085 318/400.01 |
| 2004/0130472 A1 | * | 7/2004 | Arizumi | H03F 3/217 341/152 |
| 2007/0091501 A1 | * | 4/2007 | Yang | G11B 5/5582 360/75 |
| 2008/0201586 A1 | * | 8/2008 | Onishi | G06F 1/1632 713/300 |
| 2009/0045480 A1 | | 2/2009 | Matsunaga et al. | |
| 2009/0206788 A1 | * | 8/2009 | Ando | H02P 8/22 318/696 |
| 2010/0237818 A1 | * | 9/2010 | Ohkubo | H02P 6/08 318/400.38 |
| 2010/0320955 A1 | * | 12/2010 | Ando | H02P 8/38 318/696 |
| 2012/0161689 A1 | * | 6/2012 | Yamasaki | B62D 5/0406 318/724 |
| 2013/0163126 A1 | * | 6/2013 | Dong | G06F 13/4086 361/56 |
| 2013/0265086 A1 | | 10/2013 | Chang et al. | |
| 2013/0307460 A1 | | 11/2013 | Tsuchihashi et al. | |
| 2014/0368943 A1 | * | 12/2014 | Miyagoe | H01L 27/0921 360/46 |
| 2015/0236087 A1 | | 8/2015 | Chang et al. | |
| 2015/0375714 A1 | * | 12/2015 | Umeno | B60S 1/0896 15/250.12 |
| 2016/0036296 A1 | * | 2/2016 | Kabune | H02K 11/33 310/52 |

FOREIGN PATENT DOCUMENTS

| | | | | |
|---|---|---|---|---|
| JP | 2007-234983 A | | 9/2007 | |
| JP | 2012-222934 A | | 11/2012 | |
| JP | 2013219358 A | | 10/2013 | |
| JP | 2016013710 A | * | 1/2016 | ............ B60S 1/0896 |
| JP | 2016034205 A | * | 3/2016 | ............ H02K 11/33 |

* cited by examiner

Charge period

Decay period

INTEGRATED CIRCUIT DEVICE AND ELECTRONIC APPLIANCE

BACKGROUND

1. Technical Field

The present invention relates to an integrated circuit device, an electronic appliance, and the like.

2. Related Art

It is known that motor drivers for driving DC motors and stepper motors use H-bridge circuits. An H-bridge circuit includes first to fourth driving transistors (switch elements), and the first and fourth transistors and the second and third transistors are electrically connected diagonally with respect to the motor. The first to fourth transistors are controlled so as to be on and off by a PWM signal from a pre-driver, and a drive current output by the bridge circuit varies according to the pulse width of the PWM signal.

In the case of driving a stepper motor, for example, 2-channel H-bridge circuits are used. A PWM signal from a first pre-driver is input into a first H-bridge circuit, and a PWM signal from a second pre-driver is input into a second H-bridge circuit. Then, the first H-bridge circuit causes a first drive current to flow between a first terminal and a second terminal of the stepper motor, and the second bridge circuit causes a second drive current to flow between a third terminal and a fourth terminal of the stepper motor. By switching the first drive current and the second drive current to predetermined current values in each step, the stepper motor is rotated by a predetermined angle each time one step is performed.

As a technique regarding two functional blocks and two control circuits such as 2-channel H-bridge circuits and pre-drivers described above, there is a technique disclosed in JP-A-02-50459. According to this technique, the two functional blocks are placed one above the other, and the two control circuits are placed on the right and left sides of the functional blocks. According to the invention, each H-bridge circuit is driven by a single pre-driver, but according to the technique disclosed in JP-A-02-50459, each control circuit is connected to the two functional blocks.

SUMMARY

In the case of integrating 2-channel H-bridge circuits as described above, there is a problem with the placement of pre-drivers and H-bridge circuits in the layout.

If, for example, the first pre-driver and the second pre-driver are placed together in one placement region, the length of a signal line extending from the first pre-driver to the first H-bridge circuit and the length of a signal line extending from the second pre-driver to the second H-bridge circuit may be different significantly. In this case, due to the signal lines having different impedance values, the on and off timings may be different between the H-bridge circuits. Alternatively, the layout of pre-drivers and H-bridge circuits may become inefficient depending on the positional relationship between the pre-drivers and the H-bridge circuits, resulting in an increased chip area due to the presence of dead space.

An advantage of some aspects of the invention is to provide an integrated circuit device, an electronic appliance, and the like that can achieve equalization of impedance values of signal lines for providing drive signals or a reduction in the chip area.

An aspect of the invention relates to an integrated circuit device including: a first bridge circuit that is placed in a first region on a first direction side of a reference line in plan view of a substrate of the integrated circuit device; a second bridge circuit that is placed in a second region on a second direction side that is opposite to the first direction with respect to the reference line in the plan view; a first pre-driver that drives the first bridge circuit; and a second pre-driver that drives the second bridge circuit, wherein the first pre-driver is placed in the first region, and the second pre-driver is placed in the second region.

According to one aspect of the invention, the first bridge circuit and the first pre-driver for driving the first bridge circuit are placed on the first direction side with respect to the reference line, and the second bridge circuit and the second pre-driver for driving the second bridge circuit are placed on the second direction side with respect to the reference line. For example, the first bridge circuit and the first pre-driver, and the second bridge circuit and the second pre-driver can be placed symmetrically with respect to the reference line. With this configuration, it is possible to achieve equalization of impedance values of signal lines for providing drive signals or reduction of the chip area.

Also, according to one aspect of the invention, if it is assumed that a direction that intersects the first direction and the second direction is defined as a third direction, it is possible that the first pre-driver is placed on the third direction side of the first bridge circuit, the second pre-driver is placed on the third direction side of the second bridge circuit, a first interconnect region is provided between the first pre-driver and the first bridge circuit, the first interconnect region being where a signal line connecting the first pre-driver and the first bridge circuit is provided, and a second interconnect region is provided between the second pre-driver and the second bridge circuit, the second interconnect region being where a signal line connecting the second pre-driver and the second bridge circuit is provided.

According to one aspect of the invention, the first pre-driver and the second pre-driver can be placed on the same direction side, namely, on the third direction side of the first bridge circuit and the second bridge circuit. With this configuration, the distance between the first pre-driver and the first bridge circuit, and the distance between the second pre-driver and the second bridge circuit can be reduced. Also, the length of routing of the signal lines connecting the pre-drivers and the bridge circuits in the first direction or the second direction can be reduced. For example, the signal line connecting the first pre-driver and the first bridge circuit and the signal line connecting the second pre-driver and the second bridge circuit can be configured to have the same length.

Also, according to one aspect of the invention, the first bridge circuit may include: a high-side first transistor; a low-side second transistor; a high-side third transistor; and a low-side fourth transistor, the first pre-driver may include: first to fourth driver circuits that drive the first to fourth transistors, in the first region, the first driver circuit and the third driver circuit may be placed on the first direction side of the second driver circuit and the fourth driver circuit, the second bridge circuit may include: a high-side fifth transistor; a low-side sixth transistor; a high-side seventh transistor; and a low-side eighth transistor, the second pre-driver may include: fifth to eighth driver circuits that drive the fifth to eighth transistors, and in the second region, the fifth driver circuit and the seventh driver circuit may be placed on the second direction side of the sixth driver circuit and the eighth driver circuit.

With this configuration, in the first direction or the second direction, the driver circuits for driving the low-side transistors and the driver circuits for driving the high-side transistors can be arranged in this order. This enables the driver circuits for driving the low-side transistors to be placed near a region between the two high-side transistors, and thus the signal lines from the driver circuits to the low-side transistors can be easily placed.

Also, according to one aspect of the invention, a signal line extending from the second driver circuit to the second transistor and a signal line extending from the fourth driver circuit to the fourth transistor may be provided in a region between the first transistor and the third transistor, and a signal line extending from the sixth driver circuit to the sixth transistor and a signal line extending from the eighth driver circuit to the eighth transistor may be provided in a region between the fifth transistor and the seventh transistor.

The signal lines extending from the driver circuits to the low-side transistors are placed between the high-side transistors as described above. According to one aspect of the invention, the above-described driver circuit placement makes it easy to place the signal lines from the driver circuits to the low-side transistors.

Also, according to one aspect of the invention, among transistors constituting the first driver circuit and the third driver circuit, a transistor having a first breakdown voltage and a transistor having a second breakdown voltage that is higher than the first breakdown voltage may be placed so as to extend along the first direction in the first region, and among transistors constituting the fifth driver circuit and the seventh driver circuit, a transistor having the first breakdown voltage and a transistor having the second breakdown voltage may be placed so as to extend along the second direction in the second region.

There is a rule such as, for example, a predetermined distance should be provided between transistors formed by processes of different breakdown voltages, and thus it is inefficient to place transistors formed by different processes together. In this regard, according to one aspect of the invention, it is possible to place together transistors that can be laid out according to a rule of using a process that uses the same breakdown voltage, and thus an efficient layout can be achieved.

Also, according to one aspect of the invention, the integrated circuit device may include a bias circuit that is placed between the first pre-driver and the second pre-driver, and that supplies a bias voltage to the first pre-driver and the second pre-driver.

The pre-drivers are less noise-sensitive than an analog circuit such as a detection circuit, and thus can be placed at a position closer to the bridge circuits than the analog circuit is. For this reason, the bias circuit can be placed between the first pre-driver and the second pre-driver, and thus an efficient layout can be achieved.

Also, according to one aspect of the invention, the integrated circuit device may include a guard region that is provided between the first and second bridge circuits and the first and second pre-drivers, and that sets the substrate of the integrated circuit device to have a substrate potential, and the signal line connecting the first pre-driver and the first bridge circuit and the signal line connecting the second pre-driver and the second bridge circuit may be provided on the guard region.

The bridge circuits drive an object to be driven through a chopping operation, and at this time, the transistors constituting the bridge circuits are turned on or off. For example, during a charge period, a charge current flows through the first transistor and the fourth transistor, and during a decay period, a decay current flows through the second transistor and the third transistor. Due to switching between the currents, noise reaches the substrate and is propagated to the analog circuit and the like, causing a malfunction. In this regard, according to one aspect of the invention, the guard region is provided between the bridge circuits and the pre-drivers, and it is therefore possible to absorb or block the noise. Also, the signal lines are placed on the guard region, and thus an efficient layout can be achieved.

Also, according to one aspect of the invention, the first bridge circuit and the second bridge circuit may include a high-side transistor and a low-side transistor that are DMOS transistors, and the guard region may include: a buried layer of first conductivity type that is formed in the substrate of first conductivity type; a well of first conductivity type that is formed above the buried layer of first conductivity type; and an impurity layer of first conductivity type that is formed above the well of first conductivity type.

The DMOS transistors constituting the bridge circuits have a buried layer of second conductivity type. As a result of the guard region having a buried layer of first conductivity type, the guard region can be provided at substantially the same depth as the buried layer of second conductivity type of the DMOS transistors. Since noise is generated via a parasitic diode or a parasitic capacitance between the substrate of first conductivity type and the buried layer of second conductivity type, by providing the guard region at substantially the same depth as the buried layer, it is possible to effectively absorb or block the noise.

Also, according to one aspect of the invention, terminal nodes between terminals and transistors constituting the first bridge circuit and the second bridge circuit may be formed by an uppermost interconnect layer serving as a pad interconnect, and the signal line connecting the first pre-driver and the first bridge circuit and the signal line connecting the second pre-driver and the second bridge circuit may be formed by a lower interconnect layer that is provided at a position lower than the uppermost interconnect layer.

By providing pads serving as terminals on the transistors of the bridge circuits, and forming nodes between the transistors and the terminals by using an uppermost interconnect layer serving as an interconnect between the pads, the parasitic resistance between the transistors and the terminals can be reduced. A large drive current flows through the bridge circuits, and it is therefore advantageous to reduce the parasitic resistance in terms of voltage drop and power efficiency. As described above, the transistors of the bridge circuits are covered with the uppermost interconnect layer, and thus by forming the signal lines extending from the pre-drivers to the bridge circuits by using a lower interconnect layer, an interconnect between the pre-drivers and the bridge circuits can be formed.

Also, according to one aspect of the invention, the integrated circuit device may drive a stepper motor by using a first drive current output from the first bridge circuit and a second drive current output from the second bridge circuit.

Also, according to one aspect of the invention, the integrated circuit device may include a control circuit that controls the first bridge circuit and the second bridge circuit, and if the stepper motor completes one rotation through first to Nth periods, the control circuit may control driving of the stepper motor by changing the first drive current and the second drive current when each of the first to the Nth periods is switched, and periodically changing the first drive current and the second drive current by taking the first to the Nth periods as one cycle.

In the case of driving a stepper motor by using the first bridge circuit and the second bridge circuit as described above, if the signal line connecting the first pre-driver and the first bridge circuit and the signal line connecting the second pre-driver and the second bridge circuit have different parasitic resistance values, the on and off timings of the transistors may be different between the first bridge circuit and the second bridge circuit. Also, there is the possibility that the difference in the timings may cause a problem in driving of the stepper motor. In this regard, according to one aspect of the invention, symmetric placement with respect to the reference line is possible, and thus the signal lines can have substantially the same level of parasitic resistance. This reduces the possibility of the occurrence of a problem in driving of the stepper motor.

Another aspect of the invention relates to an electronic appliance including any one of the above-described integrated circuit devices.

BRIEF DESCRIPTION OF THE DRAWINGS

The invention will be described with reference to the accompanying drawings, wherein like numbers reference like elements.

DESCRIPTION OF EXEMPLARY
EMBODIMENTS

Hereinafter, a preferred embodiment of the invention will be described in detail. It is to be noted that the embodiment described below is not intended to unduly limit the scope of the invention recited in the appended claims, and not all configurations described in the embodiment are necessarily essential to the solving means of the invention.

1. Comparative Example

Figure 1:
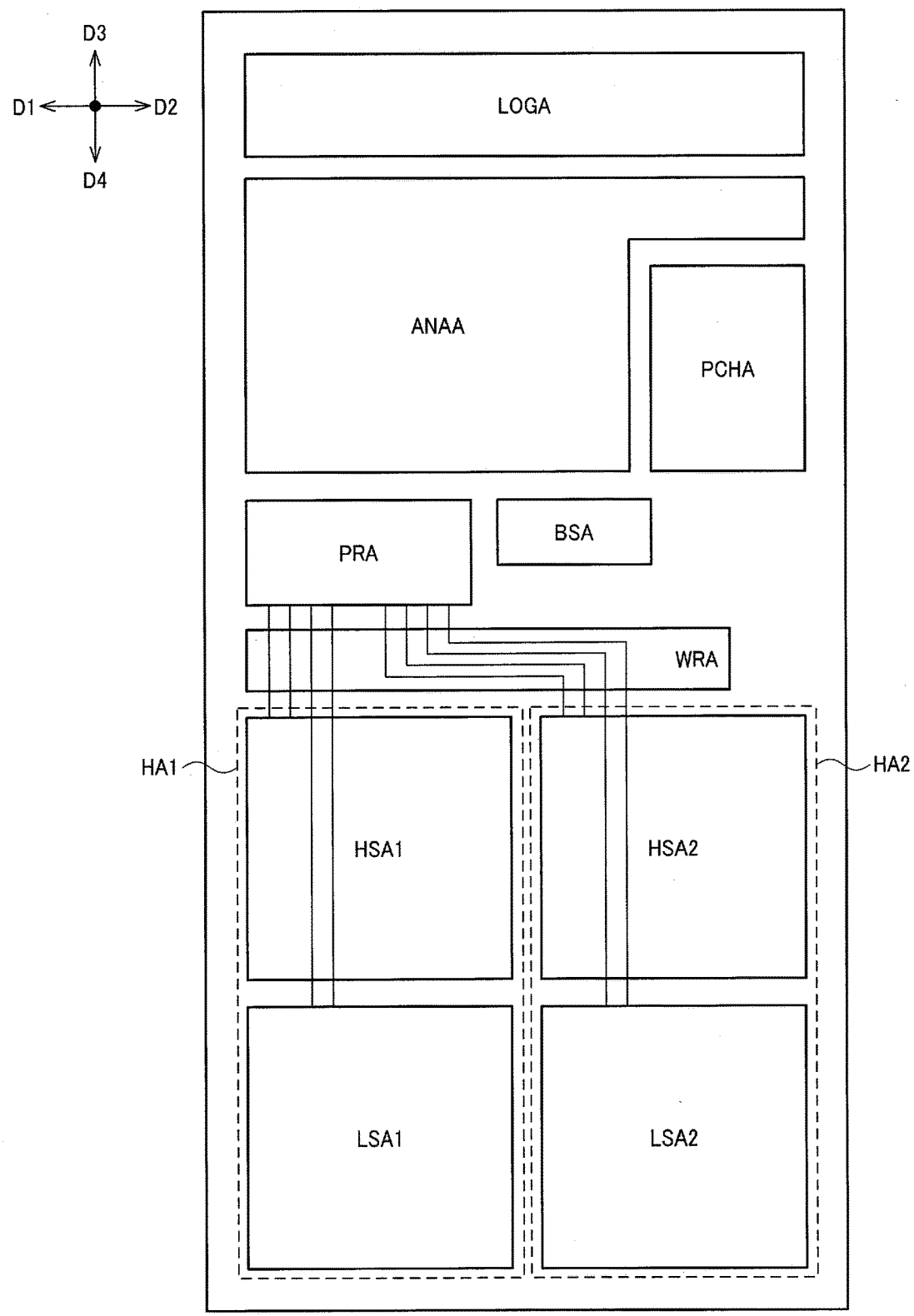
FIG. 1 shows a layout configuration of an integrated circuit device according to a comparative example of an embodiment of the invention.

FIG. 1 shows a layout configuration of an integrated circuit device according to a comparative example of an embodiment of the invention. FIG. 1 shows a layout configuration of a substrate of an integrated circuit device in plan view as viewed from a surface (the surface on which circuits are formed) of the substrate in a thickness direction of the substrate.

In the comparative example, the substrate includes a logic circuit placement region LOGA in which a logic circuit is placed, an analog circuit placement region ANAA in which an analog circuit is placed, a drive transistor placement region PCHA in which a drive transistor (P-type transistor) for driving a switching regulator is placed, a bias circuit placement region BSA in which a bias circuit is placed, a pre-driver placement region PRA in which a pre-driver is placed, a first bridge circuit placement region HA1 in which a first (first channel) bridge circuit is placed, a second bridge circuit placement region HA2 in which a second (second channel) bridge circuit is placed, and a signal line placement region WRA in which signal lines extending from the pre-driver to the first bridge circuit and the second bridge circuit are placed.

The first bridge circuit placement region HA1 and the second bridge circuit placement region HA2 are provided substantially symmetrically on the right and left sides. On the other hand, a first pre-driver for driving the first bridge circuit and a second pre-driver for driving the second bridge circuit are placed in the placement region PRA. The placement region PRA is provided at a position biased toward the first bridge circuit (on a first direction D1 side), rather than at a position symmetric with respect to the first bridge circuit placement region HA1 and the second bridge circuit placement region HA2.

Placing two pre-drivers together in one location in this way offers an advantage that a plurality of circuits of the same type can be collectively placed together. However, due to the pre-drivers not being placed symmetrically with respect to the bridge circuits, there are disadvantages.

To be specific, because the pre-driver placement region PRA is provided at a position biased toward the first bridge circuit placement region HA1, it is necessary to route signal lines connecting the pre-driver and the second bridge circuit. The bridge circuits are required to allow a large current to flow therethrough so as to drive the motor, and thus have a very large gate size. Accordingly, the signal lines need to be thick so as to lower parasitic resistance (to reduce a signal delay). This increases the size of the placement region WRA where signal lines are routed, and causes the size of the chip area to increase.

In addition, because the bridge circuits turn on and off the transistors having a large gate size, a very large switching noise is generated with respect to the substrate of the integrated circuit device. It is therefore necessary to provide the analog circuit placement region ANAA, which is noise sensitive, at a position away from the bridge circuit placement regions HA1 and HA2. Because the pre-drivers are provided between the first bridge circuit placement region HA1 and the analog circuit placement region ANAA, the analog circuit placement region ANAA can be spaced apart from the bridge circuit placement regions HA1 and HA2. However, it is likely that this may create a space between the second bridge circuit placement region HA2 and the analog circuit placement region ANAA, which makes it difficult to achieve an efficient arrangement.

In addition, the signal lines extending from the first pre-driver to the first bridge circuit and the signal lines extending from the second pre-driver to the second bridge circuit do not have the same length, and thus the parasitic resistance (impedance) varies between interconnects. The transistors of the bridge circuits have a large gate size, and thus have a large gate capacitance. For this reason, if the parasitic resistance varies between signal lines, the on and off timings of the transistors may be different significantly. As will be described later with reference to FIG. 10, in the case of driving a stepper motor, 2-channel bridge circuits are used in collaboration, and thus there is the possibility that a problem may occur in motor control if the on and off timings do not match. For example, the following problem may occur: the motor does not smoothly rotate (produces large vibrations); an expected torque cannot be obtained; and the occurrence of loss of synchronization (the rotation does not follow the drive pulse) increases.

2. Example of Layout Configuration

Figure 2:
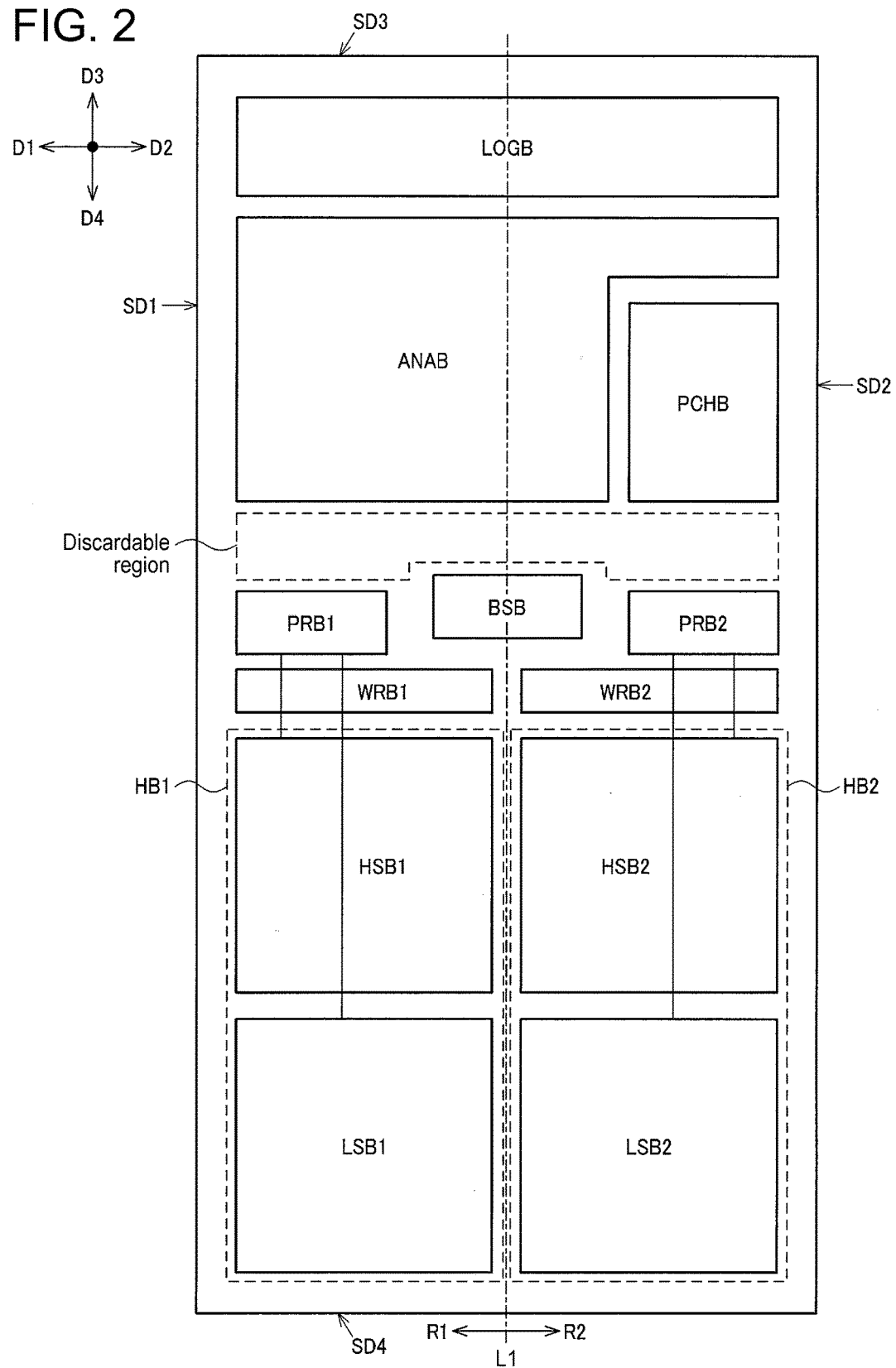
FIG. 2 shows an example of a layout configuration of an integrated circuit device according to the embodiment.

FIG. 2 shows an example of a layout configuration of an integrated circuit device ("circuit device" in a broad sense) according to an embodiment of the invention with which the above-described problems can be solved. FIG. 2 shows an example of a layout configuration of a substrate of the integrated circuit device in plan view as viewed from a surface (the surface on which circuits are formed) of the substrate in a thickness direction of the substrate.

The substrate of the integrated circuit device includes a logic circuit placement region LOGE in which a logic circuit is placed, an analog circuit placement region ANAB in which an analog circuit is placed, a drive transistor placement region PCHB in which a drive transistor (P-type transistor) for driving a switching regulator is placed, a bias circuit placement region BSB in which a bias circuit is placed, a first pre-driver placement region PRB1 in which a first pre-driver is placed, a second pre-driver placement region PRB2 in which a second pre-driver is placed, a first bridge circuit placement region HB1 in which a first (first channel) bridge circuit is placed, a second bridge circuit placement region HB2 in which a second (second channel) bridge circuit is placed, a signal line placement region WRB1 (first interconnect region) in which signal lines extending from the first pre-driver to the first bridge circuit are placed, and a signal line placement region WRB2 (second interconnect region) in which signal lines extending from the second pre-driver to the second bridge circuit are placed.

The substrate of the integrated circuit device has first to fourth sides SD1 to SD4. The first side SD1 and the second side SD2 are opposite sides. The third side SD3 and the fourth side SD4 are opposite sides intersecting (for example, perpendicularly) with the first side SD1 and the second side SD2. Also, the first to fourth sides SD1 to SD4 are sides that are located respectively in first to fourth directions D1 to D4 as viewed from the center of the substrate. The first direction D1 and the second direction D2 are opposite directions (with an angle of 180 degrees). The third direction D3 and the fourth direction D4 are opposite directions (with an angle of 180 degrees) intersecting (for example, perpendicularly) with the first direction D1 and the second direction D2.

In the logic circuit placement region LOGE, a control circuit 20 and a register unit 50 shown in FIG. 7, which will be described later, are placed. The region LOGE is provided so as to extend along the third side SD3.

Figure 7:
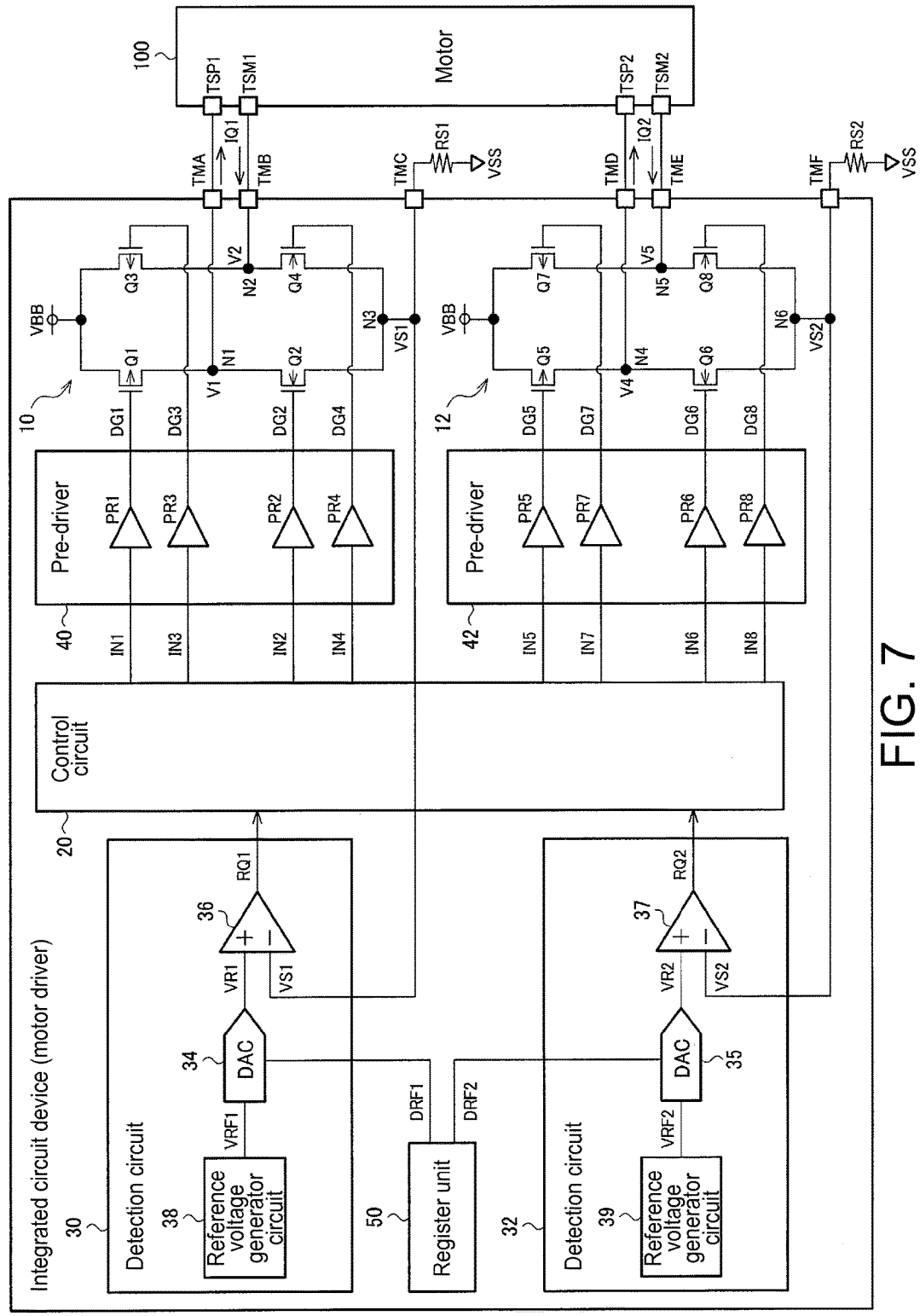
FIG. 7 shows an example of a circuit configuration of the integrated circuit device according to the embodiment.

In the analog circuit placement region ANAB, a first detection circuit 30 and a second detection circuit 32 shown in FIG. 7 are placed. The region ANAB is provided between the logic circuit placement region LOGE and the first and second pre-driver placement regions PRB1 and PRB2.

The switching regulator (not shown in FIG. 7) is a circuit that supplies power to, for example, an external processing unit (micro-computer). The drive transistor provided in the region PCHB is a transistor that outputs a drive current to an external coil. The constituent elements constituting the switching regulator other than the drive transistor are placed in, for example, the analog circuit placement region ANAB. The region PCHB is provided at a position on the second direction D2 side of the analog circuit placement region ANAB so as to extend along the second side SD2.

In the first pre-driver placement region PRB1, a first pre-driver 40 shown in FIG. 7 is placed. The region PRB1 is provided between the analog circuit placement region ANAB and the first bridge circuit placement region HB1.

In the bias circuit placement region BSB, a bias circuit (not shown in FIG. 7) that supplies a bias voltage for driving the transistors of the bridge circuits to the pre-drivers is provided. The bias voltage includes a high-side bias voltage (VBH=37 V shown in FIG. 11) and a low-side bias voltage (VBL=5 V shown in FIG. 12).

In the first bridge circuit placement region HB1, a first bridge circuit 10 shown in FIG. 7 is provided. The region HB1 is provided so as to extend along the first side SD1 and the fourth side SD4. To be more specific, the region HB1 includes a high-side transistor placement region HSB1 in which high-side transistors (Q1 and Q3) are placed, and a low-side transistor placement region LSB1 in which low-side transistors (Q2 and Q4) are placed. The high-side transistor placement region HSB1 is provided between the low-side transistor placement region LSB1 and the first pre-driver placement region PRB1.

In the second bridge circuit placement region HB2, a second bridge circuit 12 shown in FIG. 7 is provided. The region HB2 is provided so as to extend along the second side SD1 and the fourth side SD4. To be more specific, the region HB2 includes a high-side transistor placement region HSB2 in which high-side transistors (Q5 and Q7) are placed and a low-side transistor placement region LSB2 in which low-side transistors (Q6 and Q8) are placed. The high-side transistor placement region HSB2 is provided between the low-side transistor placement region LSB2 and the second pre-driver placement region PRB2.

(Claim 1)

According to the above-described embodiment, the first bridge circuit (the region HB1) is placed in a first region R1 located on the first direction D1 side of a reference line L1 in plan view of the substrate of the integrated circuit device. The second bridge circuit (the region HB2) is placed in a second region R2 located on the second direction D2 side of the reference line L1 in plan view of the substrate of the integrated circuit device. The first pre-driver (the region PRB1) for driving the first bridge circuit is placed in the first region R1. The second pre-driver (the region PRB2) for driving the second bridge circuit is placed in the second region R2.

With this configuration, the first pre-driver is placed in the same first region R1 as the first bridge circuit, and the second pre-driver is placed in the same second region R2 as the second bridge circuit. This enables 2-channel bridge circuits and pre-drivers to be placed symmetrically (or substantially symmetrically) with respect to the reference line L1. Such symmetric placement eliminates the lopsided placement of pre-drivers described in the comparative example, and thus can provide an efficient arrangement. For example, the distance between the third side SD3 and the fourth side SD4 can be reduced by an amount corresponding to a discardable region shown in FIG. 2, and thus the size of the layout area can be reduced as compared to that of the comparative example. Also, the symmetric placement enables the signal lines between the pre-drivers and the bridge circuits to be placed symmetrically, and thus enables the signal lines to have the same (or substantially the same) parasitic resistance. As a result of the signal lines having the same parasitic resistance, the switching timing can be the same between the 2-channels, and thus the problem that comes with the control of the stepper motor described in the comparative example can be reduced.

The reference line L1 is a line dividing the plane of the substrate into the first region R1 and the second region R2. The reference line L1 extends along the third direction D3 (or the fourth direction D4) and intersects with the third side SD3 and the fourth side SD4. For example, the reference line L1 is parallel to the first side SD1 (or the second side SD2), and intersects with the third side SD3 at the midpoint of the third side SD3 and with the fourth side SD4 at the midpoint of the fourth side SD4.

(Claim 2)

Also, in the present embodiment, the first pre-driver (the region PRB1) is placed at a position on the third direction D3 side of the first bridge circuit (the region HB1). The second pre-driver (the region PRB2) is placed at a position on the third direction D3 side of the second bridge circuit (the region HB2). Then, the first interconnect region WRB1 is provided between the first pre-driver and the first bridge circuit, the first interconnect region WRB1 being where signal lines between the first pre-driver and the first bridge circuit are provided. The second interconnect region WRB2 is provided between the second pre-driver and the second bridge circuit, the second interconnect region WRB2 being where signal lines between the second pre-driver and the second bridge circuit are provided.

To be more specific, the first pre-driver and the first bridge circuit are placed in an adjacent relationship without a circuit other than the interconnect therebetween. Likewise, the second pre-driver and the second bridge circuit are placed in an adjacent relationship without a circuit other than the interconnect therebetween.

With this configuration, each channel bridge circuit and a pre-driver for driving the bridge circuit are placed in an adjacent relationship such that the pre-driver is located at a position on the third direction D3 side of the bridge circuit. As compared with the comparative example, the distance between the pre-driver and the bridge circuit (in particular, the distance between the second pre-driver and the second bridge circuit) is reduced, and thus the length of the signal lines can be shortened. As described in the comparative example, the signal lines have a large width so as to reduce the parasitic resistance, but in the present embodiment, the routing length is short, and thus the size of the interconnect regions WRB1 and WRB2 can be reduced. In particular, the routing length in the horizontal direction (D1, D2) from the second pre-driver to the second bridge circuit can be reduced, and thus the size of the interconnect regions in the vertical direction (D3, D4) can be reduced, and space can be further saved in the layout area.

(Claim 6)

Also, in the present embodiment, a bias circuit (the region BSB) that supplies a bias voltage to the first pre-driver and the second pre-driver is placed between the first pre-driver (the region PRB1) and the second pre-driver (the region PRB2).

The bias voltage is a voltage used to perform switching in the bridge circuits, and thus the bias circuit is less noise-sensitive than the analog circuit (the detection circuit 30 and the like shown in FIG. 7). For this reason, the bias circuit can be placed at a position closer to the bridge circuits than the analog circuit is. The first pre-driver and the second pre-driver are placed separately in the first region R1 and the second region R2, and thus a space is formed therebetween. By placing a bias circuit in the formed space, it is possible to achieve an efficient layout. In addition, because the bias circuit (and the pre-drivers) are provided between the analog circuit and the bridge circuits, the analog circuit can be spaced apart from the bridge circuits and away from the noise source (bridge circuits).

3. First Example of Detailed Layout Configuration

Figure 3:
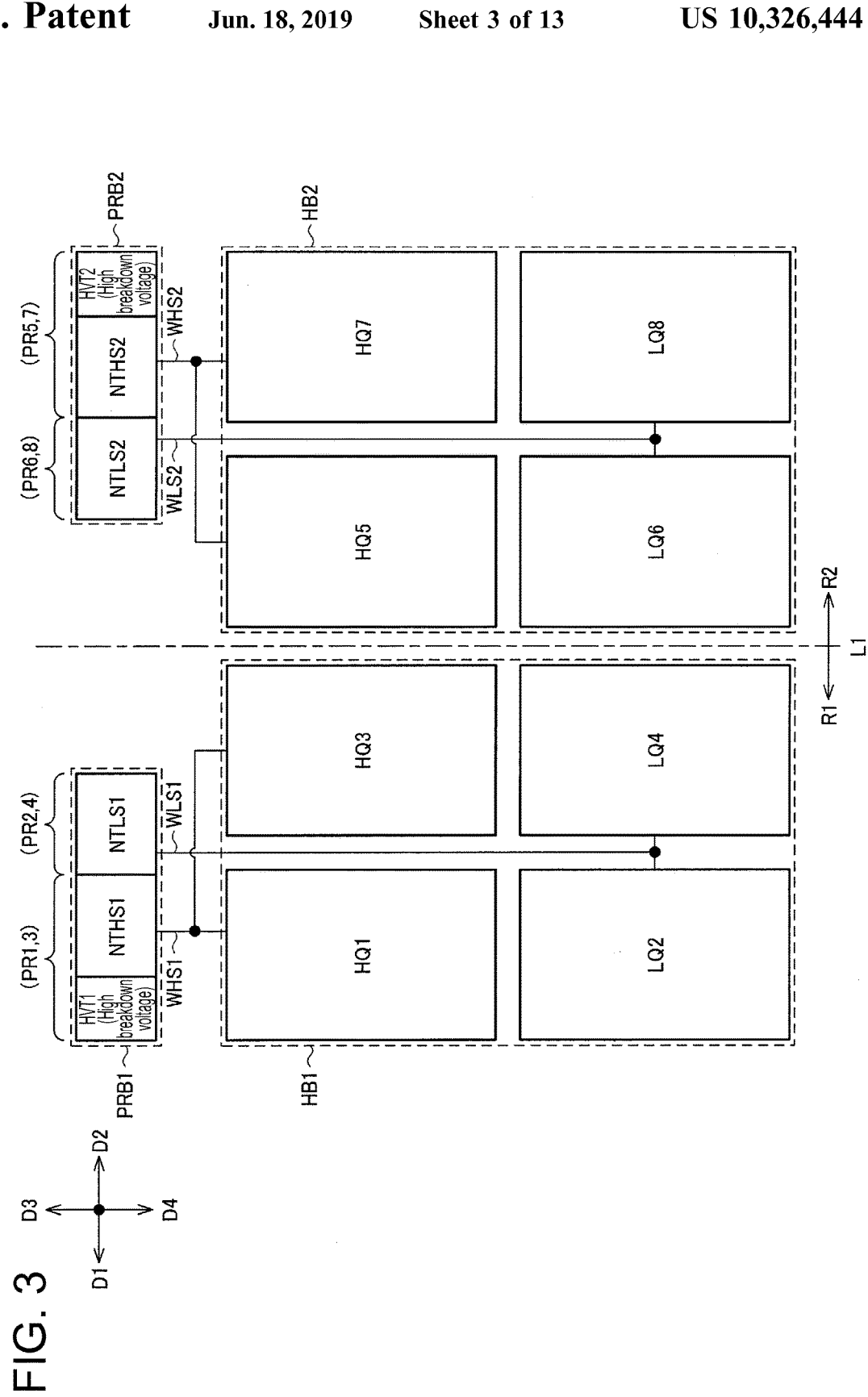
FIG. 3 shows a first example of a detailed layout configuration of the integrated circuit device according to the embodiment.

FIG. 3 shows a first example of a detailed layout configuration of the integrated circuit device according to the present embodiment. FIG. 3 shows an example of a layout configuration of the bridge circuits and the pre-drivers.

Claims 3 and 4

The first bridge circuit includes a high-side first transistor (Q1 shown in FIG. 7), a low-side second transistor (Q2), a high-side third transistor (Q3), and a low-side fourth transistor (Q4). The first bridge circuit placement region HB1 includes regions HQ1, LQ2, HQ3 and LQ4, and the first to fourth transistors are placed respectively in the regions HQ1, LQ2, HQ3 and LQ4. The region HQ3 is placed at a position on the first direction D1 side of the region HQ1. The regions LQ2 and LQ4 are placed respectively at positions on the fourth direction D4 side of the regions HQ1 and HQ3.

The first pre-driver includes first to fourth driver circuits (PR1 to PR4 shown in FIG. 7) for driving the first to fourth transistors (Q1 to Q4). The first pre-driver placement region PRB1 includes regions HVT1, NTHS1, and NTLS1. In the regions HVT1 and NTHS1, the first driver circuit and the third driver circuit (PR1 and PR3) for driving the high-side transistors (Q1 and Q3) are placed, and in the region NTLS1, the second driver circuit and the fourth driver circuit (PR2 and PR4) for driving the low-side transistors (Q2 and Q4) are placed. The regions NTHS1 and HVT1 are placed at positions on the first direction D1 side of the region NTLS1. In other words, the regions NTLS1, NTHS1 and HVT1 are placed in this order along the first direction D1. The second and fourth driver circuits for driving the low-side transistors and the first and third driver circuits for driving the high-side transistors are placed along first direction D1 in the first region R1.

In order to reduce the parasitic resistance, the transistors of the bridge circuit are covered with the metal of an interconnect layer, and thus there is a limited space for, in particular, signal lines extending from the driver circuits to the low-side transistors. For this reason, the routing length of the signal lines tends to be long. In this regard, in the present embodiment, the driver circuits are placed along the first direction D1 in order from the low-side driver circuits to the high-side driver circuits. It is thereby possible to place the driver circuits (the region NTLS1) for driving the low-side transistors near a region between the two high-side transistor placement regions HQ1 and HQ3. As a result, the length of routing of the signal lines can be reduced.

To be specific, a signal line extending from the second driver circuit (PR2) to the second transistor (Q2, region LQ2) and a signal line extending from the fourth driver circuit (PR4) to the fourth transistor (Q4, region LQ4) are provided in a region between the first transistor (Q1, the region HQ1) and the third transistor (Q3, the region HQ3). In FIG. 3, these signal lines are schematically indicated by WLS1.

As described above, the signal lines extending to the low-side transistors are allowed to run between the two high-side transistors (Q1 and Q3). In the example of layout configuration of the present embodiment, the distance from the driver circuits (the region NTLS1) for driving the low-side transistors to the two high-side transistors (Q1 and Q3) is reduced, and thus the need for excess interconnect routing can be eliminated, and the size of the interconnect region (WRB1 shown in FIG. 2) can be reduced.

The same applies to the second bridge circuit and the second pre-driver. To be specific, the second bridge circuit includes a high-side fifth transistor (Q5 shown in FIG. 7), a low-side sixth transistor (Q6), a high-side seventh transistor (Q7), and a low-side eighth transistor (Q8). The second bridge circuit placement region HB2 includes regions HQ5, LQ6, HQ7 and LQ8, and the fifth to eighth transistors are placed respectively in the regions HQ5, LQ6, HQ7 and LQ8. The region HQ5 is placed at a position on the first direction D1 side of the region HQ7. The regions LQ6 and LQ8 are placed respectively at positions on the fourth direction D4 side of the regions HQ5 and HQ7.

The second pre-driver includes fifth to eighth driver circuits (PR5 to PR8 shown in FIG. 7) for driving the fifth to eighth transistors (Q5 to Q8). The second pre-driver placement region PRB2 includes regions HVT2, NTHS2 and NTLS2. In the regions HVT2 and NTHS2, the fifth and seventh driver circuits (PR5, PR7) for driving the high-side transistors (Q5, Q7) are placed, and in the region NTLS2, the sixth and eighth driver circuits (PR6 and PR8) for driving the low-side transistors (Q6 and Q8) are placed. The regions NTHS2 and HVT2 are placed at positions on the second direction D2 side of the region NTLS2. In other words, the regions NTLS2, NTHS2 and HVT2 are placed in this order along the second direction D2. The sixth and eighth driver circuits for driving the low-side transistors and the fifth and seventh driver circuits for driving the high-side transistors are placed along the second direction D2 in the second region R2.

The signal line extending from the sixth driver circuit (PR6) to the sixth transistor (Q6, region LQ6) and the signal line extending from the eighth driver circuit (PR8) to the eighth transistor (Q8, region LQ8) are provided in a region between the fifth transistor (Q5, region HQ5) and the seventh transistor (Q7, region HQ7). In FIG. 3, these signal lines are schematically indicated by WLS2.

In the example of layout configuration of the present embodiment, the distance from the driver circuits (the region NTLS2) for driving the low-side transistors to the two high-side transistors (Q5 and Q7) can be reduced, and thus the need for excess interconnect routing can be eliminated, and the size of the interconnect region (WRB2 shown in FIG. 2) can be reduced.

(Claim 5)

As described above, the first driver circuit and the third driver circuit are driver circuits that drive the high-side transistors of the first bridge circuit. These driver circuits each include, for example, a level shifter unit LSH and a buffer unit DRH, which will be described later with reference to FIG. 11. Among transistors constituting the level shifter unit LSH, transistors TPHA1, TPHA2, TNHA1 and TNHA2 are second breakdown voltage (high breakdown voltage) transistors, and are placed in the region HVT1. Other transistors constituting the level shifter unit LSH, namely, transistors TPA1 and TPA2, and transistors TPA3 to TPA5 and TNA1 to TNA3 included in the buffer unit DRH are first breakdown voltage (normal breakdown voltage) transistors, and are placed in the region NTHS1. Parenthetically, transistors constituting the second driver circuit and the fourth driver circuit that are placed in the region NTLS1 are normal breakdown voltage transistors.

As used herein, "first breakdown voltage" refers to a breakdown voltage of transistors of a normal process, which corresponds to, for example, the voltage (5V) of the power supply of the analog circuit. Likewise, "second breakdown voltage" refers to a breakdown voltage of transistors for a high breakdown voltage process, which is higher than the first breakdown voltage. For example, the second breakdown voltage corresponds to the voltage (42V) of a bridge circuit power supply VBB.

The regions HVT1, NTHS1 and NTLS1 are placed along the first direction D1 in the order of NTLS1, NTHS1 and HVT1. In other words, among the transistors constituting the first driver circuit and the third driver circuit, the first breakdown voltage transistors (the region NTHS1) and the second breakdown voltage transistors (the region HVT1) having a breakdown voltage higher than the first breakdown voltage are placed along the first direction D1 in the first region R1.

The same applies to the fifth driver circuit and the seventh driver circuit that drive the second channel high-side transistors. To be specific, in the region HVT2, second breakdown voltage (high breakdown voltage) transistors TPHA1, TPHA2, TNHA1 and TNHA2 are placed. In the region NTHS2, first breakdown voltage (normal breakdown voltage) transistors TPA1 to TPA5 and TNA1 to TNA3 are placed.

The regions HVT2, NTHS2 and NTLS2 are placed along the second direction D2 in the order of NTLS2, NTHS2 and HVT2. In other words, among the transistors constituting the fifth driver circuit and the seventh driver circuit, the first breakdown voltage transistors (the region NTHS2) and the second breakdown voltage transistors (the region HVT2) having a breakdown voltage higher than the first breakdown voltage are placed along the second direction D2 in the second region R2.

With this configuration, the transistors for a high breakdown voltage process, which are laid out according to a rule different from a normal process, can be collectively placed together in one location. Also, the transistors for a high breakdown voltage process occupy a large area, and thus by arranging the high breakdown voltage transistors and the normal breakdown voltage transistors in the horizontal direction (the first direction D1, the second direction D2), a horizontally long layout can be achieved, and the transistors can be efficiently placed along the upper side of the bridge circuit placement region HB1, HB2. In other words, the size in the vertical direction can be reduced, and space can be saved in the chip area.

4. Second Example of Detailed Layout Configuration

Figure 4:
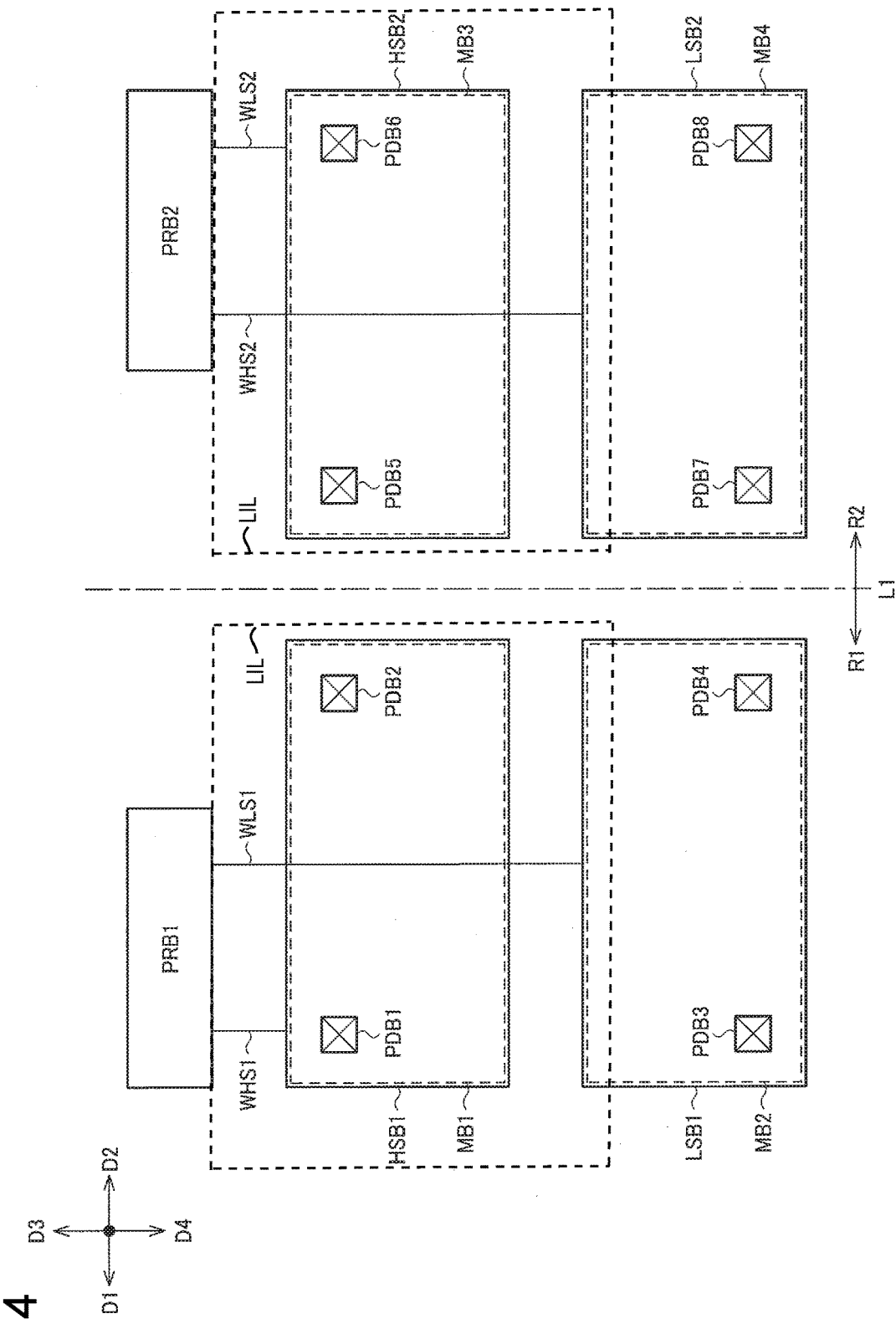
FIG. 4 shows a second example of a detailed layout configuration of the integrated circuit device according to the embodiment.

FIG. 4 shows a second example of a detailed layout configuration of the integrated circuit device according to the present embodiment. FIG. 4 shows an example of a layout configuration of the bridge circuits and the pre-drivers.

(Claim 9)

As shown in FIG. 4, terminal nodes between terminals and the transistors (the regions HSB1, LSB1, HSB2 and LSB2) constituting the first bridge circuit and the second bridge circuit are formed in interconnect layer areas MB1 to MB4 that constitute an uppermost layer serving as a pad interconnect. Then, signal lines WHS1 and WLS1 between the first pre-driver (the region PRB1) and the first bridge circuit, and signal lines WHS2 and WLS2 between the second pre-driver (the region PRB2) and the second bridge circuit are formed by a lower interconnect layer LIL that is provided at a position lower than the interconnect layer areas MB1 to MB4 constituting the uppermost layer. The uppermost interconnect layer, and the lower interconnect layer that is provided at a position lower than the uppermost layer are formed of metal layers (for example, aluminum layers) and are configured to electrically connect circuit elements. The interconnect layers are connected by, for example, vias or contacts (for example, tungsten).

A detailed description will be given by taking the first bridge circuit as an example. The interconnect layer area MB1 corresponds to a source node of the high-side transistors (Q1 and Q3 shown in FIG. 7), and is provided so as to cover the high-side transistors (the region HSB1). In the interconnect layer area MB1, pads PDB1 and PDB2 to be bonded to terminals of the power supply VBB of a package are provided. The pads PDB1 and PDB2 are the interconnect layer area MB1 constituting the uppermost layer, and rectangles indicating the pads are provided to show designed positions of the pads.

Likewise, the interconnect layer area MB2 corresponds to a source node of the low-side transistors (Q2 and Q4 shown in FIG. 7), and is provided so as to cover the low-side transistors (the region LSB1). In the interconnect layer area MB2, pads PDB3 and PDB4 corresponding to terminals to which one end of a sense resistor is connected (TMC shown in FIG. 7) are provided. The pads PDB3 and PDB4 are the interconnect layer area MB2 constituting the uppermost layer, and rectangles indicating the pads are provided to show designed positions of the pads.

Although not illustrated in FIG. 4, pads corresponding to terminals (TMA and TMB shown in FIG. 7) connecting to a motor, and an uppermost interconnect layer that serves as a pad interconnect thereof are also provided.

As described above, the transistors of the bridge circuit are covered with the uppermost interconnect layer serving as a pad interconnect. This is done so as to reduce the resistance of interconnects extending from the pads to the transistors as much as possible, so as to reduce the power loss caused by parasitic resistance. Then, as a result of the signal lines WHS1 and WLS1 extending from the pre-driver being formed by a lower interconnect layer, it is possible to allow the signal lines to run under the pad interconnect while reducing the power loss. The pad interconnect and the transistors are connected by the lower interconnect layer, and thus it is difficult to allow the signal lines to run over the transistors even with the use of the lower interconnect layer. In this regard, as described above with reference to FIG. 3, because the low-side pre-drivers are placed near a region between the high-side transistors, the signal line WLS1 can be efficiently provided.

5. Third Example of Detailed Layout Configuration (Claim 7)

As will be described with reference to FIG. 7 and other diagrams, when the bridge circuit 10 drives a motor 100 by using a chopping current, a large current flows through the drains of the transistors Q1 to Q4 constituting the bridge circuit 10. Because the large current is turned on and off by a chopping operation, and the direction in which the large current flows is reversed, the drain voltage of the transistors Q1 to Q4 of the bridge circuit 10 undergoes a large potential change. In response to the occurrence of such a potential change, the potential change becomes noise, which negatively affects the analog circuit such as the detection circuit 30, and causes a problem in, for example, the detection operation performed by the detection circuit 30.

Figure 8A:
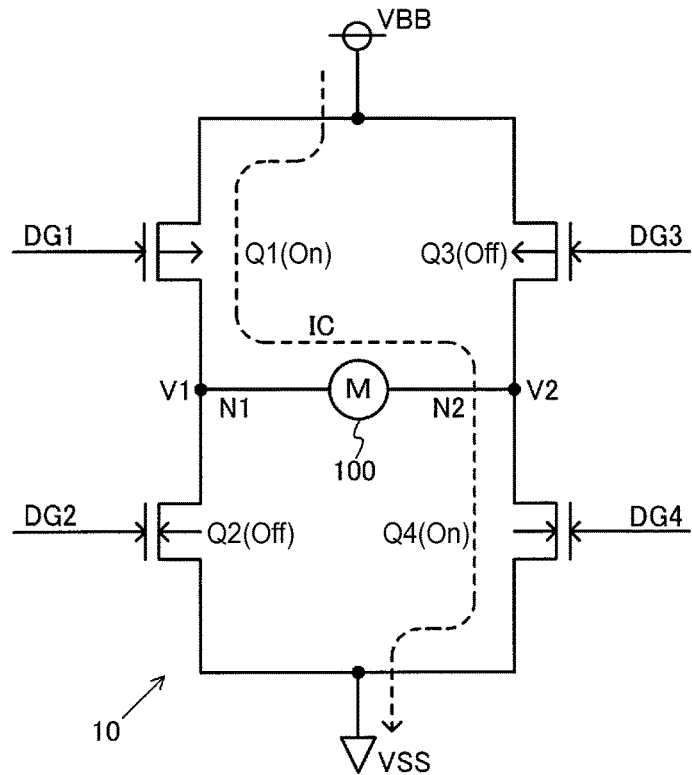
FIG. 8A is a diagram illustrating an operation during a charge period.
Figure 8B:
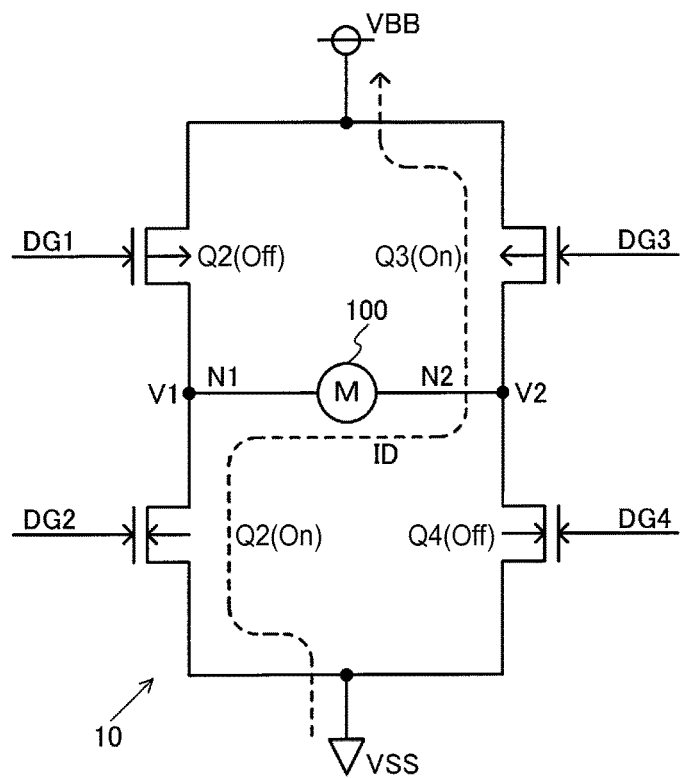
FIG. 8B is a diagram illustrating an operation during a decay period.

For example, during a decay period shown in FIG. 8B, a decay current ID flows from a low potential-side power supply VSS to a high potential-side power supply VBB via the transistor Q2, the motor 100 and the transistor Q3. Accordingly, a negative voltage, which is a potential on the negative side with respect to the power supply VSS (GND), is applied to the drain (node N1) of the low-side transistor Q2. For this reason, a parasitic diode formed in the region where the N-type transistor Q2 is located is driven into a forward bias state, thereby generating noise that significantly changes the potential of the substrate. There is a problem in that the noise negatively affects the analog circuit of the circuit device, and impedes accurate circuit operations. For example, a problem occurs in a circuit operation of comparing a voltage VS1 of a sense resistor RS1 with a reference voltage VR1 performed by the detection circuit 30, which is an analog circuit, and false detection of chopping current or the like may occur.

Figure 5:
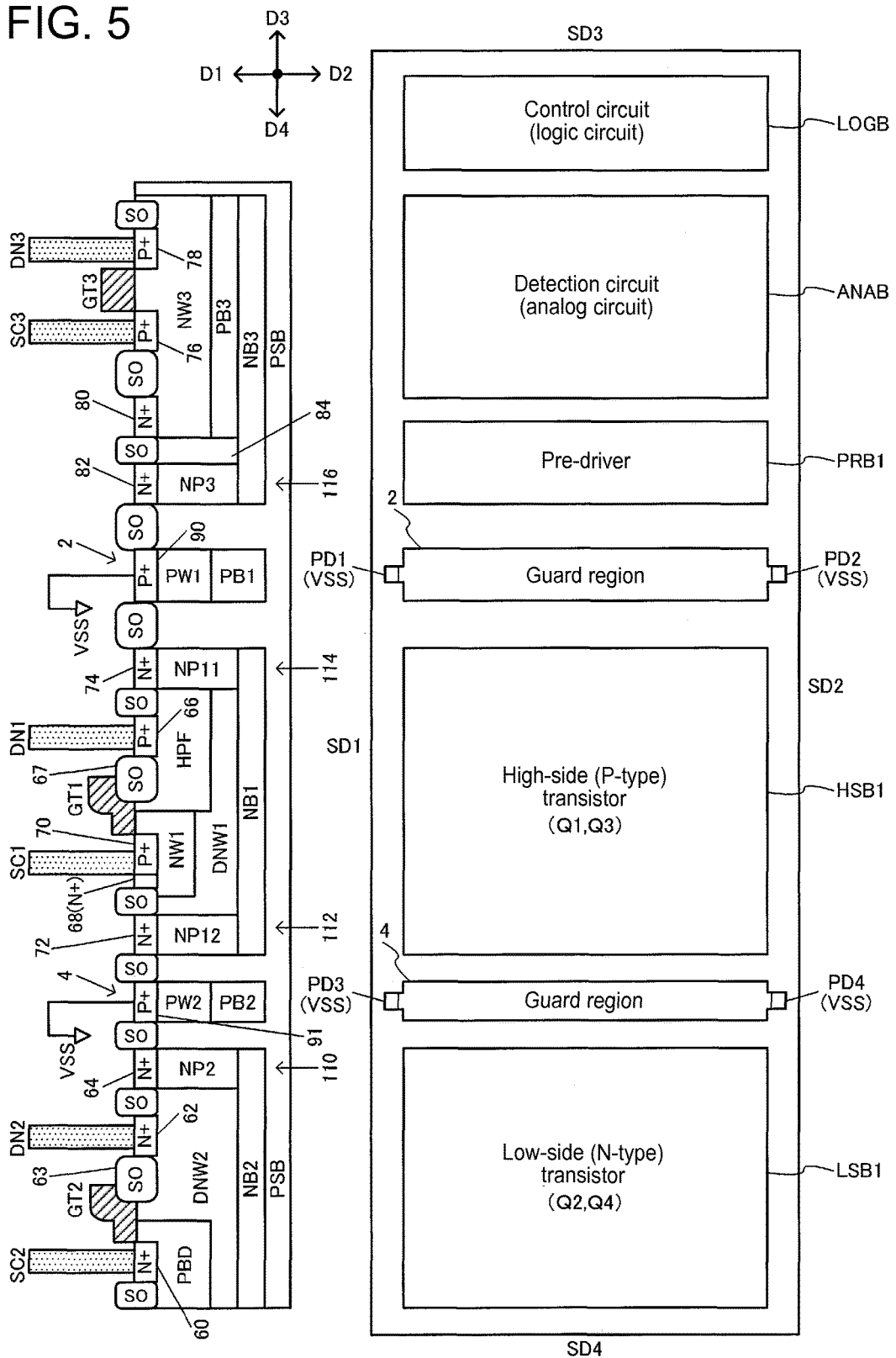
FIG. 5 shows a third example of a detailed layout configuration of the integrated circuit device according to the embodiment, and a cross-sectional view schematically showing a cross-section of a semiconductor chip.

FIG. 5 shows a third example of a detailed layout configuration of the integrated circuit device according to the present embodiment with which the above-described problem can be solved. The right side of FIG. 5 shows a plan view of a semiconductor chip of the integrated circuit device as viewed from above, and the left side of FIG. 5 shows a cross-sectional view schematically showing a cross-section of the semiconductor chip of the integrated circuit device. In the plan view, the first bridge circuit is illustrated as an example.

As shown in the diagram showing the plan view (circuit placement layout diagram) on the right side of FIG. 5, a guard region 2 for setting the substrate PSB of the integrated circuit device to have a substrate potential (for example, VSS=GND) is provided between the pre-driver (the region PRB1) and the high-side transistors Q1 and Q3 (the region HSP1) and the low-side transistors Q2 and Q4 (the region LSB1).

It is assumed that, for example, a first side of the semiconductor chip is represented by SD1, a second side that is opposite to the side SD1 is represented by SD2, a side that is perpendicular to (intersects) the sides SD1 and SD2 is denoted as a third side SD3, and a side that is opposite to the side SD3 is denoted as a fourth side SD4. The first direction D1 is the direction extending from the side SD2 toward the side SD1. In this case, the guard region 2 is provided at a position on the direction D3 side of the high-side transistors Q1 and Q3 and the low-side transistors Q2 and Q4, and the pre-driver is provided at a position on the direction D3 side of the guard region 2. Also, the guard region 2 is formed so as to extend along, for example, the direction D1 in a region between the pre-driver and the high-side transistors Q1 and Q3. That is, the guard region 2 is formed such that the longitudinal direction extends along the direction D1.

Also, as shown in FIG. 5, the integrated circuit device includes a guard region 4 (second guard region) for setting the substrate PSB to have a substrate potential, provided between the high-side transistors Q1 and Q3 and the low-side transistors Q2 and Q4. In other words, the guard region 4 is provided at a position on the direction D4 side of the high-side transistors Q1 and Q3, and the low-side transistors Q2 and Q4 are provided at a position on the direction D4 side of the guard region 4. A variation is possible in which only the guard region 2 is provided by omitting the guard region 4.

The guard regions 2 and 4 have a function called "guard ring" that absorbs and blocks noise. The guard region 2 can be formed by a metal interconnect (aluminum interconnect, or the like) electrically connected to pads PD1 and PD2, and an impurity layer that is formed on the substrate PSB and is electrically connected to the metal interconnect via a contact or the like. The guard region 4 can be formed by a metal interconnect (aluminum interconnect, or the like) electrically connected to pads PD3 and PD4, and an impurity layer that is formed on the substrate PSB and is electrically connected to the metal interconnect via a contact or the like.

If the substrate PSB is of P-type (first conductivity type), the impurity layer is also of P-type. The impurity layer is, for example, an impurity diffusion layer. The pads PD1 to PD4 receive a power supply VSS (GND). The pads PD1 to PD4 are electrodes formed on the semiconductor substrate, and may be pads for wire bonding or may be pads for bumps (Bump on Pad). The pads PD1 to PD4 are formed in, for example, an I/O region in the integrated circuit device. The I/O region is a region for performing input and output of signals and voltage with respect to the outside, and where, for example, a pad and an electrostatic protection element (I/O cell) are provided.

In FIG. 5, the guard regions 2 and 4 have a rectangular shape extending along the direction D1 in plan view, but the shape of the guard regions 2 and 4 is not limited thereto. The guard regions 2 and 4 may have, for example, a shape curved toward the direction D3 or the direction D4.

In the present embodiment, the signal lines WHS1 and WLS1 between the first pre-driver and the first bridge circuit and the signal lines WHS2 and WLS2 between the second pre-driver and the second bridge circuit shown in FIG. 3 and other diagrams are provided on the guard region 2. In other words, the interconnect regions WRB1 and WRB2 shown in FIG. 2 are regions that entirely or partially overlap the guard region 2.

With this configuration, noise propagation from the bridge circuit to the detection circuit can be reduced by the guard region 2, and the interconnect region can be effectively used by providing signal lines on the guard region 2. That is, even if noise caused by the chopping operation of the bridge circuit as described above is generated, the guard region 2 (or 4) provided in the interconnect region absorbs and blocks the noise, and thus the occurrence of problem in the circuit operations of the integrated circuit device can be suppressed.

6. Device Structure

Next is a detailed description of device structures of transistors included in the integrated circuit device according to the present embodiment, with reference to the cross-sectional view on the left side of FIG. 5. In the present embodiment, as shown in the cross-sectional view of FIG. 5, DMOS (Double-diffused Metal Oxide Semiconductor) transistors are used as the transistors Q1 to Q4 constituting the bridge circuit. On the other hand, CMOS (Complementary Metal Oxide Semiconductor) transistors are used as the transistors constituting the detection circuit, the logic circuit and the like.

A device structure of the low-side N-type transistors Q2 and Q4 (hereinafter, also referred to as "N-type DMOS" where appropriate) will be described first.

Hereinafter, the description will be given assuming that the first conductivity type is P-type, but the first conductivity type may be N-type. For example, in FIG. 5, the substrate PSB is a substrate of P-type, but a substrate of N-type may be used as the substrate PSB. In addition, in a direction (thickness direction) vertical to the plane of the substrate PSB of the integrated circuit device, the direction on a side of the substrate PSB on which circuits are formed (the side where layers are laminated by a semiconductor process) will be referred to as "above", and the opposite direction will be referred to as "below".

Above the P-type (first conductivity type) substrate PSB, which is a silicon substrate, an N-type (second conductivity type) buried layer NB2 (N+ Buried Layer) is formed. Above the N-type buried layer NB2, a deep N-type well DNW2 of the N-type DMOS is formed. On a source SC2 side of the deep N-type well DNW2, a P-type body PBD (P-type impurity layer) is formed. Then, above the P-type body PBD, an N-type impurity layer 60 corresponding to the source SC2 of the N-type DMOS is formed. Likewise, on a drain DN2 side of the deep N-type well DNW2, an N-type impurity layer 62 corresponding to the drain DN2 of the N-type DMOS is formed. The N-type impurity layers 60 and 62 are made of, for example, an N-type impurity diffusion layer.

Above the deep N-type well DNW2, an insulating layer 63 (for example, SiO2) is formed so as to be in contact with the N-type impurity layer 62 corresponding to the drain DN2. The insulating layer 63 is formed by a so-called LOCOS (Local Oxidation Of Silicon) process. Then, a gate layer GT2 (for example, poly-silicon layer) is formed above the P-type body PBD, the deep N-type well DNW2 and the insulating layer 63. In FIG. 5 and diagrams which will be described later, insulating layers are indicated by SO.

In a boundary region 110 provided on the direction D3 side (the guard region 4 side) of the N-type DMOS, an N-type plug NP2 (N-type impurity layer) for supplying a potential to the N-type buried layer NB2 is provided. To be specific, the N-type plug NP2 is formed above the N-type buried layer NB2, and an N-type impurity layer 64 is formed above the N-type plug NP2. A P-type impurity layer (not shown) may be formed on both sides of the N-type plug NP2. The N-type impurity layer 64 receives, for example, a supply of the same voltage as the voltage of the drain DN2, and the voltage applied to the N-type impurity layer 64 is supplied to the N-type buried layer NB2 via the N-type plug NP2.

It is desirable to provide an N-type plug in a boundary region provided on the direction D4 side of the N-type DMOS as well. The buried layer is an impurity layer formed at a position lower than the substrate surface impurity layer (for example, the deep N-type well and the P-type body) provided on the surface of the substrate. To be specific, by introducing an N-type impurity or P-type impurity into the silicon substrate and causing an epitaxial layer (a layer made of monocrystals of silicon) to grow thereon, the buried layer is formed below the epitaxial layer.

Next is a description of a device structure of the high-side P-type transistors Q1 and Q3 (hereinafter, also referred to as "P-type DMOS" where appropriate).

Above the P-type substrate PSB, an N-type buried layer NB1 is formed, and above the N-type buried layer NB1, a deep N-type well DNW1 is formed. Above the deep N-type well DNW1, a P-type impurity layer HPF (HPOF) is formed, and above the P-type impurity layer HPF, a P-type impurity layer 66 (diffusion layer) corresponding to a drain DN1 of the P-type DMOS is formed. Above the deep N-type well DNW1, an N-type well NW1 (low breakdown voltage N-type well) is formed. In the N-type well NW1, an N-type impurity layer 68 and a P-type impurity layer 70 corresponding to a source SC1 of the P-type DMOS are formed. An insulating layer 67 is formed so as to be in contact with the P-type impurity layer 66 corresponding to the drain DN1, and a gate layer GT1 (for example, a poly-silicon layer) is formed above the N-type well NW1, the P-type impurity layer HPF and the insulating layer 67.

In a boundary region 112 provided on the direction D4 side (the guard region 4 side) of the P-type DMOS, an N-type plug NP12 (N-type impurity layer) for supplying a voltage to the N-type buried layer NB1 is provided. To be specific, the N-type plug NP12 is formed above the N-type buried layer NB1, and an N-type impurity layer 72 is formed above the N-type plug NP12. A P-type impurity layer (not shown) may be formed on the direction D3 side of the N-type plug NP12. The N-type impurity layer 72 receives, for example, a supply of voltage of the high potential-side power supply (VBB), and the voltage of the high potential-side power supply is supplied to the N-type buried layer NB1 via the N-type plug NP12.

In a boundary region 114 provided on the direction D3 side (the guard region 2 side) of the P-type DMOS, an N-type plug NP11 (N-type impurity layer) for supplying a voltage to the N-type buried layer NB1 is provided. To be specific, the N-type plug NP11 is formed above the N-type buried layer NB1, and an N-type impurity layer 74 is formed above the N-type plug NP11. A P-type impurity layer (not shown) may be formed on the direction D4 side of the N-type plug NP11. The N-type impurity layer 74 receives, for example, a supply of voltage of the high potential-side power supply (VBB), and the voltage of the high potential-side power supply is supplied to the N-type buried layer NB1 via the N-type plug NP11.

Next is a description of a device structure of a P-type CMOS transistor (hereinafter also referred to as "PMOS" where appropriate). The PMOS is a transistor constituting the detection circuit 30. The detection circuit 30 is configured by the PMOS and an N-type CMOS transistor (hereinafter also referred to as "NMOS" where appropriate), which is not shown in FIG. 5.

In a region where the detection circuit 30 is formed, an N-type buried layer NB3 for separating the PMOS and the NMOS, which are CMOS transistors, from the substrate PSB is formed. To be specific, the N-type buried layer NB3 is formed above the P-type substrate PSB, and a P-type buried layer PB3 is formed above the N-type buried layer NB3. Then, the PMOS and the NMOS, which are CMOS transistors, are formed above the P-type buried layer PB3.

For example, above the P-type buried layer PB3, a PMOS N-type well NW3 (for example, medium breakdown voltage N-type well) is formed, and in the N-type well NW3, a P-type impurity layer 76 corresponding to a source SC3 of the PMOS is formed. Above the N-type well NW3, a P-type impurity layer 78 corresponding to a drain DN4 of the PMOS is formed. A gate layer GT3 is formed above the N-type well NW3 between the P-type impurity layer 76 and the P-type impurity layer 78. Above the N-type well NW3, an N-type impurity layer 80 for supplying a voltage to the N-type well NW3 is further formed. The N-type impurity layer 80 receives, for example, a supply of voltage of the high potential-side power supply.

In a boundary region 116 provided on the direction D4 side (the guard region 2 side) of the PMOS, an N-type plug NP3 for supplying a potential to the N-type buried layer NB3 is provided. To be specific, the N-type plug NP3 is formed above the N-type buried layer NB3, and an N-type impurity layer 82 is formed above the N-type plug NP3. A P-type impurity layer 84 is formed on the direction D3 side of the N-type plug NP3. A P-type impurity layer (not shown) may be formed on the direction D4 side of the N-type plug NP3. The voltage of the high potential-side power supply applied to the N-type impurity layer 82 is supplied to the N-type buried layer NB3 via the N-type plug NP3.

In the case of forming the NMOS constituting the detection circuit 30, the NMOS having a CMOS structure, a P-type well (for example, medium breakdown voltage N-type well) is formed above the P-type buried layer PB3. Then, an N-type impurity layer serving as a drain of the NMOS, an N-type impurity layer serving as a source of the NMOS, and a P-type impurity layer for supplying the voltage of the low potential-side power supply (VSS) to the P-type well are formed in the P-type well. In this way, the NMOS having a CMOS structure can be formed.

7. Guard Region (Claim 7)

Figure 6:
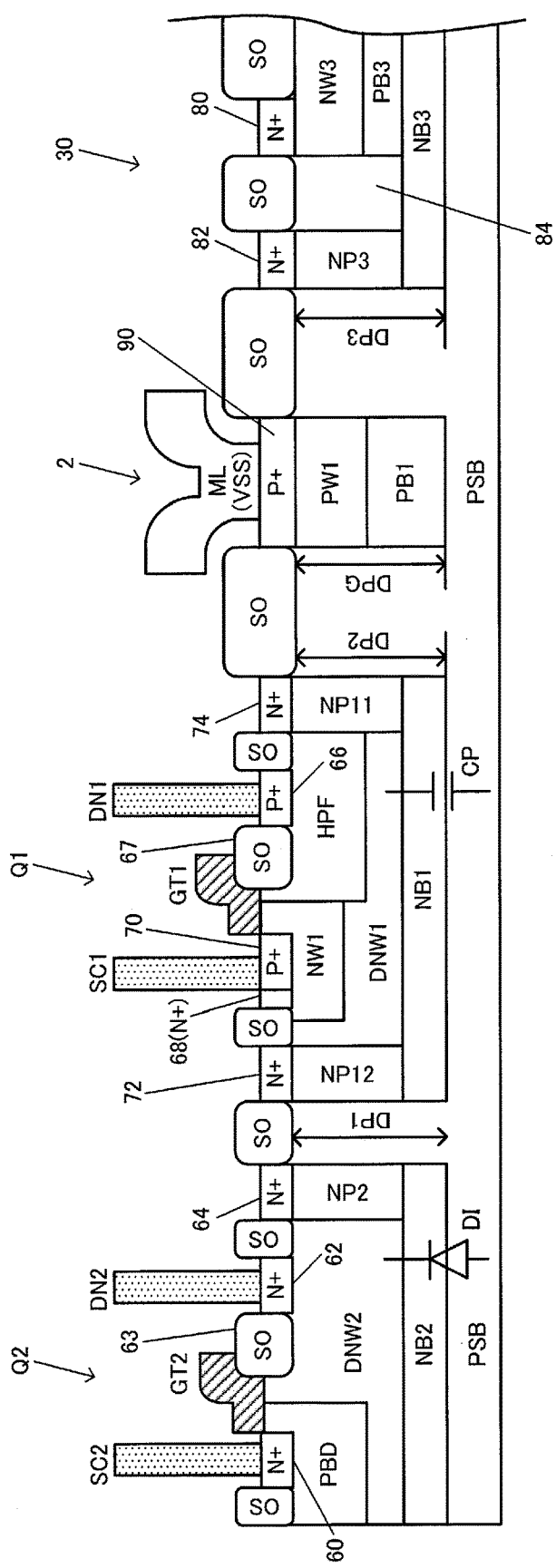
FIG. 6 is a diagram illustrating a guard region.

Next is a detailed description of the guard region 2 with reference to FIG. 6. The guard region 4 has the same structure as the guard region 2, and thus a detailed description thereof is omitted.

As shown in FIG. 6, the guard region 2 includes a P-type (i.e., first conductivity type, the same applies hereinafter) buried layer PB1 (P+ Buried Layer), a P-type well PW1 (low breakdown voltage P-type well), and a P-type impurity layer 90 (P-type diffusion layer). The P-type buried layer PB1 is formed on the P-type substrate PSB. The P-type well PW1 is formed above the P-type buried layer PB1. The P-type impurity layer 90 is formed above the P-type well PW1. The P-type impurity layer 90 is electrically connected to a metal layer ML (aluminum layer) via a contact. The metal layer ML forms a metal interconnect for supplying the low potential-side power supply VSS, and is electrically connected to the pads PD1 and PD2 shown in FIG. 5. For example, the pads PD1 and PD2 are electrically connected by a metal interconnect formed by the metal layer ML. With this configuration, the voltage (ground voltage) of the VSS applied to the P-type impurity layer 90 via the pads PD1 and PD2 and the metal layer ML is supplied to the substrate PSB via the P-type buried layer PB1 and the P-type well PW1, as a result of which the potential of the substrate PSB can be stabilized.

The P-type well PW1 (PW2) is a layer formed by introducing a P-type impurity into an epitaxial layer. With this configuration, the P-type well PW1 can be formed by, after formation of the P-type buried layer PB1, causing an epitaxial layer to grow and then introducing a P-type impurity into the epitaxial layer. By forming the P-type well PW1 in this way, the voltage of the power supply VSS applied to the P-type impurity layer 90 can be delivered to the P-type buried layer PB1 via the P-type well PW1.

Also, as described above, the high-side transistor Q1 (Q3) and the low-side transistor Q2 (Q4) are DMOS transistors. By using transistors having such a DMOS structure, even if a high voltage power supply VBB (for example, 40 to 50 V) is used as the power supply of the motor driver, a sufficient breakdown voltage can be ensured for the transistors, and the motor 100 can be appropriately driven.

In the present embodiment, the P-type buried layer PB1 is provided also in the guard region 4 by utilizing the fact that the DMOS transistors Q1 and Q2 are formed on the N-type buried layers NB1 and NB2. In other words, it is easy to form the P-type buried layer PB1 (PB2) after (or before) the N-type buried layers NB1 and NB2 are formed on the P-type substrate PSB. Accordingly, the guard region 2 can be formed so as to extend from the surface of the P-type substrate PSB (the surface on which circuits are formed) to the P-type buried layer PB1 which is located at a deep position. By forming the guard region 2 so as to extend to such a deep position, the noise absorbing and blocking function of the guard region 2 can be further improved.

The noise absorbing and blocking function of the guard region 2 will be described in detail. As shown in FIG. 6, a parasitic diode D1 is formed between the P-type substrate PSB and the N-type buried layer NB2 and the deep N-type well DNW2 of the low-side transistor Q2. The parasitic diode D1 is a diode having a forward direction extending from the P-type substrate PSB toward the N-type buried layer NB2. As described above, during the decay period shown in FIG. 8B, the parasitic diode D1 is driven into a forward bias state, thereby generating noise that significantly changes the potential of the P-type substrate PSB that is set to have VSS.

Likewise, in the region where the high-side transistor Q1 is formed, there is a parasitic capacitance CP between the P-type substrate PSB and the N-type buried layer NB1. When the bridge circuit drives the motor by using a chopping current, a large current flows through the drain DN1 (the P-type impurity layer 66) of the transistor Q1. Because the large current is turned on and off by a chopping operation, and the direction in which the large current flows is reversed, the voltage of the drain DN1 undergoes a significant change. The voltage change of the drain DN1 is delivered to the P-type substrate PSB via the parasitic capacitance CP, and noise that significantly changes the substrate potential is generated.

The generation of noise as described above negatively affects the analog circuit such as the detection circuit 30, and causes circuit malfunctioning or the like. For example, in the integrated circuit device shown in FIG. 7, the chopping current flowing through the bridge circuit 10 is maintained at a constant level by the detection circuit 30 comparing the voltage VS1 at one end of the sense resistor RS1 with the reference voltage VR1. At this time, if a comparator circuit 36, a reference voltage generator circuit 38 and a D/A conversion circuit 34 included in the detection circuit 30 receive the influence of noise delivered to the detection circuit 30 via the P-type substrate PSB, a problem may occur in the detection operation performed by the detection circuit 30. If, for example, the accuracy of comparison of the comparator circuit 36 decreases, or the reference voltage VR1 varies, false detection of chopping current or the like may occur.

In an ordinary guard region called "guard ring", only a P-type impurity diffusion layer (90 in FIG. 6) is formed. Such a guard region is problematic in that the depth distance from the substrate surface cannot be increased, and thus noise from the DMOS transistors Q1 and Q2 cannot be efficiently absorbed and blocked.

In this regard, according to the present embodiment, the P-type buried layer PB1 of the guard region 2 is formed so as to correspond to the N-type buried layers NB1 and NB2 of the transistors Q1 and Q2 of the bridge circuit 10. In addition, in the guard region 2, the P-type well PW1 is formed by introducing an impurity into the epitaxial layer formed above the P-type buried layer PB1, so as to correspond to the deep N-type wells DNW1 and DNW2 formed by introducing an impurity into an epitaxial layer formed above the N-type buried layers NB1 and NB2. It is therefore possible to set a depth distance DPG of the guard region 2 from the substrate surface to be the same distance as depth distances DP1 and DP2 of the transistors Q1 and Q2. Accordingly, noise from the DMOS transistors Q1 and Q2 can be efficiently absorbed and blocked by the guard region 2 formed so as to extend to the depth distance DPG in the depth direction.

8. Circuit Configuration

FIG. 7 shows an example of a circuit configuration of the integrated circuit device according to the present embodiment. The integrated circuit device of the present embodiment includes the first bridge circuit 10, the second bridge circuit 12, the control circuit 20, the first detection circuit 30, the second detection circuit 32, the first pre-driver 40, the second pre-driver 42, and the register unit 50.

Hereinafter, a circuit configuration and operations will be described by using, as an example, the first bridge circuit 10, the first detection circuit 30 and the first pre-driver 40. A description of a circuit configuration and operations of the second bridge circuit 12, the second detection circuit 32 and the second pre-driver 42 is omitted because the circuit configuration and the operations are the same. Also, FIG. 7 shows an example in which the motor 100 is a stepper motor, but the motor 100 may be a DC motor. In this case, one DC motor is connected to each of the first bridge circuit 10 and the second bridge circuit 12.

The bridge circuit 10 includes the high-side transistors Q1 and Q3 and the low-side transistors Q2 and Q4. The bridge circuit 10 is a circuit that outputs a drive current to the motor 100 (for example, a DC motor, a stepper motor, or the like), and has an H-bridge circuit configuration in FIG. 7.

The high-side transistors Q1 and Q3 are, for example, P-type ("first conductivity type" in a broad sense) transistors, and the low-side transistors Q2 and Q4 are, for example, N-type ("second conductivity type" in a broad sense) transistors. As used herein, "high-side transistor" refers to a transistor that is connected to a higher potential power supply side than a low-side transistor. "Low-side transistor" refers to a transistor that is connected to a lower potential power supply side than a high-side transistor. All of the transistors Q1, Q2, Q3 and Q4 may be N-type transistors. Also, an unshown body diode (parasitic diode) is provided between the source and the drain in the transistors Q1, Q2, Q3 and Q4.

The sources of the high-side transistors Q1 and Q3 are connected to a node of the high potential-side power supply VBB (first power supply). The sources of the low-side transistors Q2 and Q4 are connected to a node N3 to which one end of the sense resistor RS1 is connected. The node N3 is connected to one end of the sense resistor RS1, which is an external component, via a terminal TMC of the integrated circuit device.

The drain of the transistor Q1 and the drain of the transistor Q2 are connected to a node N1 that is connected to a first terminal of the external motor 100 ("object to be driven" in a broad sense). The node N1 is connected to a first terminal TSP1 of the motor 100 via a terminal TMA of the integrated circuit device.

The drain of the transistor Q3 and the drain of the transistor Q4 are connected to a node N2 that is connected to a second terminal of the motor 100. The node N2 is connected to a second terminal TSM1 of the motor 100 via a terminal TMB of the integrated circuit device.

The detection circuit 30 detects a current flowing through the bridge circuit 10. The detection circuit 30 detects, for example, a charge current during a charge period by detecting the voltage VS1 at one end of the sense resistor RS1. To be specific, the detection circuit 30 includes the reference voltage generator circuit 38, the D/A conversion circuit 34, and the comparator circuit 36 (comparator).

The reference voltage generator circuit 38 generates a reference voltage VRF1 that is a constant voltage. The D/A conversion circuit 34 receives the reference voltage VRF1, and generates a reference voltage VR1 that is variable according to setting data DRF1. The setting data DRF1 is stored in the register unit 50, and the setting data DRF1 is written into the register unit 50 by, for example, an external controller (for example, a micro-computer or the like). The comparator circuit 36 receives an input of the reference voltage VR1 at a first input terminal (non-inverting input terminal), receives an input of the voltage VS1, which is the voltage at one end of the sense resistor RS1, at a second input terminal (inverting input terminal), and outputs a detection result signal RQ1. For example, as will be described later, the chopping current is determined by the reference voltage VR1 input into the comparator circuit 36, and thus the torque of the motor 100 can be controlled by changing the setting data DRF1 so as to change the reference voltage VR1.

The control circuit 20 performs control so as to turn the high-side transistors Q1 and Q3 and the low-side transistors Q2 and Q4 on and off based on the result of detection performed by the detection circuit 30. To be specific, the control circuit 20 generates control signals IN1, IN2, IN3 and IN4 as PWM signals that perform switching from the charge period to the decay period when the detection result signal RQ1 from the detection circuit 30 becomes active.

The pre-driver 40 includes the driver circuits PR1, PR2, PR3 and PR4. The driver circuits PR1, PR2, PR3 and PR4 buffer the control signals IN1, IN2, IN3 and IN4 from the control circuit 20, and output drive signals DG1, DG2, DG3 and DG4 to the gates of the transistors Q1, Q2, Q3 and Q4.

The integrated circuit device shown in FIG. 7 is constituted by, for example, an IC chip, and the terminals TMA to TMF correspond to terminals of the IC chip package or pads on the semiconductor substrate. In this case, the integrated circuit device, which is an IC chip, is mounted on a circuit board (a printed circuit board or the like), and the sense resistors RS1 and RS2, which are external circuit components, are also mounted on the circuit board. Then, the sense resistors RS1 and RS2 and the terminals TMC and TMF are electrically connected by an interconnect provided on the circuit board.

Next, operations performed by the bridge circuit 10 of the integrated circuit device according to the present embodiment will be described with reference to FIGS. 8A, 8B and 9.

As shown in FIG. 8A, during the charge period, the transistors Q1 and Q4 are turned on. As a result, a charge current IC flows from the high potential-side power supply VBB to the low potential-side power supply VSS (GND) via the transistor Q1, the motor 100 (motor coil) and the transistor Q4.

During the decay period, on the other hand, as shown in FIG. 8B, the transistors Q2 and Q3 are turned on, and a decay current ID flows from the power supply VSS to the power supply VBB via the transistor Q2, the motor 100 and the transistor Q3. The charge current IC and the decay current ID both flow from the first terminal TSP1 to the second terminal TSM1 of the motor 100.

In the case of causing the charge current IC and the decay current ID to flow in a reversed direction opposite to the above (so as to take a negative current value), the transistors Q2 and Q3 are turned on during the charge period, and the transistors Q1 and Q4 are turned on during the decay period. In this case, the charge current IC and the decay current ID both flow from the second terminal TSM1 to the first terminal TSP1 of the motor 100 (the current flowing from the first terminal TSP1 to the second terminal TSM1 takes a negative current value).

As described with reference to FIG. 7, the sense resistor RS1 is provided between the node N3 to which the sources of the transistors Q2 and Q4 are connected and the node of the power supply VSS, and the comparator circuit 36 compares the voltage VS1 of the node N3 with the reference voltage VR1. Then, as shown in FIG. 9, the control circuit 20 controls the chopping operation that maintains a chopping current ICP flowing through the bridge circuit 10 at a constant level. To be specific, the control circuit 20 controls the pulse width of the PWM signals (IN1 to IN4) such that the chopping current ICP is constant, and the transistors Q1 to Q4 are controlled so as to be on and off based on the PWM signals.

Figure 9:
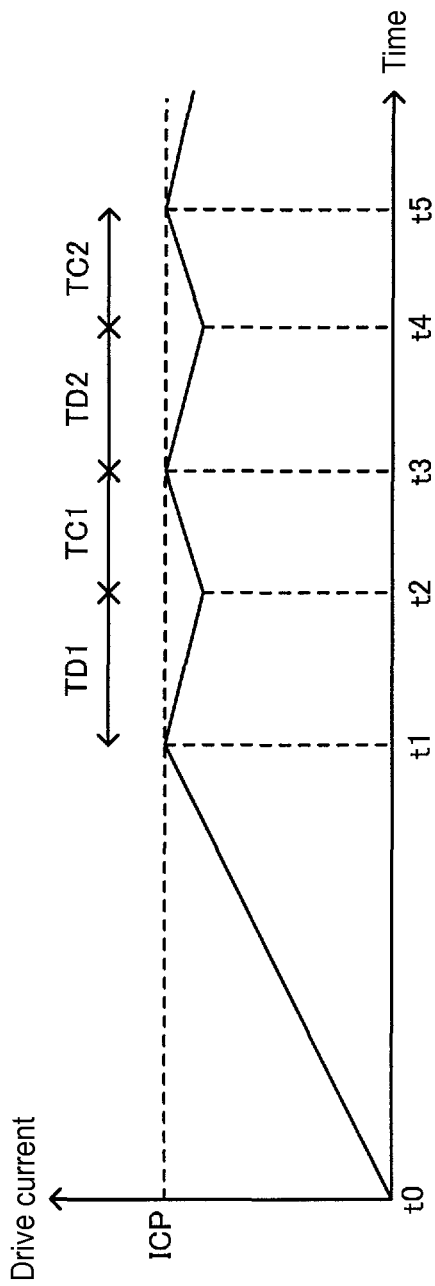
FIG. 9 is a diagram illustrating a chopping operation.

For example, if driving of the motor 100 starts at timing t0 shown in FIG. 9, the motor enters the charge period shown in FIG. 8A, and the transistors Q1 and Q4 are turned on, and the transistors Q2 and Q3 are turned off. As a result, the drive current (the charge current IC) flows from the power supply VBB to the power supply VSS via the transistor Q1, the motor 100 and the transistor Q4. Then, at timing t1 at which the drive current of the motor 100 reaches the chopping current ICP, the period is switched to a decay period TD1. To be specific, if the drive current increases and the voltage VS1 of the node N3 exceeds the reference voltage VR1, the comparison result signal RQ1 of the comparator circuit 36 rises from a low level to a high level, and the period is switched to the decay period TD1 at the timing t1. The drive current of the motor 100 at the timing t1 is the chopping current ICP, from which it can be seen that the chopping current ICP is detected upon detection of the voltage VS1.

When the period is switched to the decay period TD1, as shown in FIG. 8B, the transistors Q2 and Q3 are turned on, and the transistors Q1 and Q4 are turned off. As a result, the drive current (the decay current ID) flows from the power supply VSS to the power supply VBB via the transistor Q2, the motor 100 and transistor Q3. During the decay period TD1, as shown in FIG. 9, the drive current of the motor 100 decreases over time.

Then, the control circuit 20 detects, by using, for example, a timer (counter circuit) or the like, that a predetermined length of time has passed from the start of the decay period TD1, and switches the period from the decay period TD1 to a charge period TC1. During the charge period TC1, the drive current of the motor 100 increases, and when the drive current of the motor 100 reaches the chopping current ICP, the charge period TC1 is switched to a decay period TD2. Thereafter, by repeating this processing, control is performed so as to maintain the chopping current ICP, which is a peak current of the drive current, to be constant, and thereby to maintain the torque of the motor 100 to be constant.

In the foregoing description, an example was described in which the bridge circuit 10 is an H-bridge type circuit, but the present embodiment is not limited thereto, and the bridge circuit 10 may be a half-bridge type circuit. In this case, the transistors Q3 and Q4 are not provided as the bridge circuit 10, and only the transistors Q1 and Q2 are provided. Also, in the foregoing description, an example was described in which the integrated circuit device is a motor driver for driving the motor 100, but the object to be driven by the integrated circuit device according to the present embodiment is not limited to the motor 100, and various elements and devices having inductors (coils) can be used as the object to be driven.

9. Method for Driving Stepper Motor

Claims 10 and 11

A method for driving a stepper motor when the integrated circuit device according to the present embodiment drives a stepper motor will be described with reference to FIG. 10. Hereinafter, a description will be given by taking single-phase driving of a 4-pole bipolar motor as an example, but the invention is not limited thereto. For example, the number of poles may be 24 or 48, or a unipolar motor may be used, or micro step driving may be performed.

Figure 10:
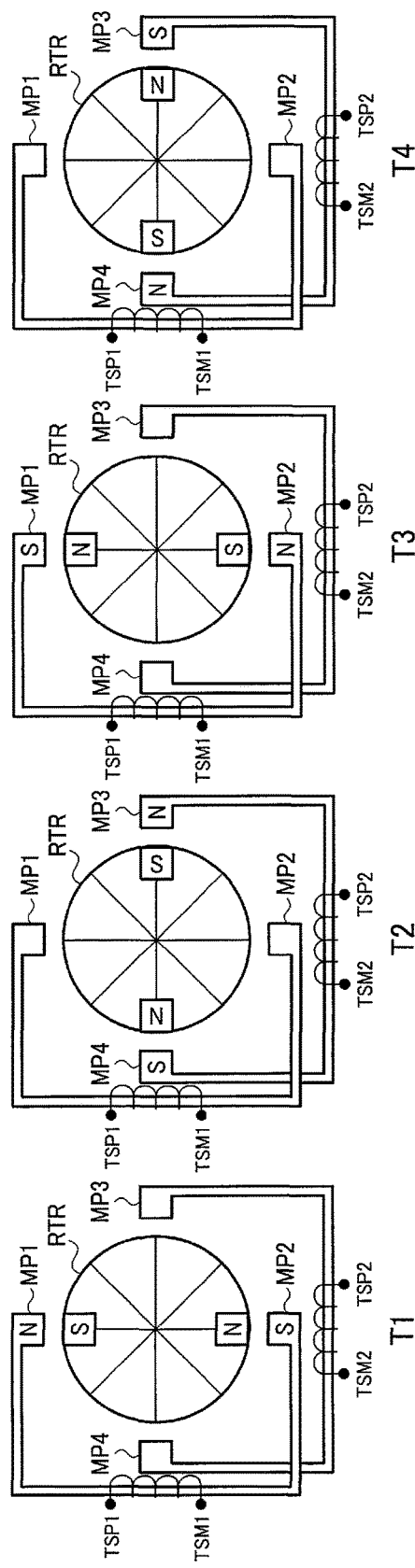
FIG. 10 is a diagram illustrating a method for driving a stepper motor.
Figure 10:
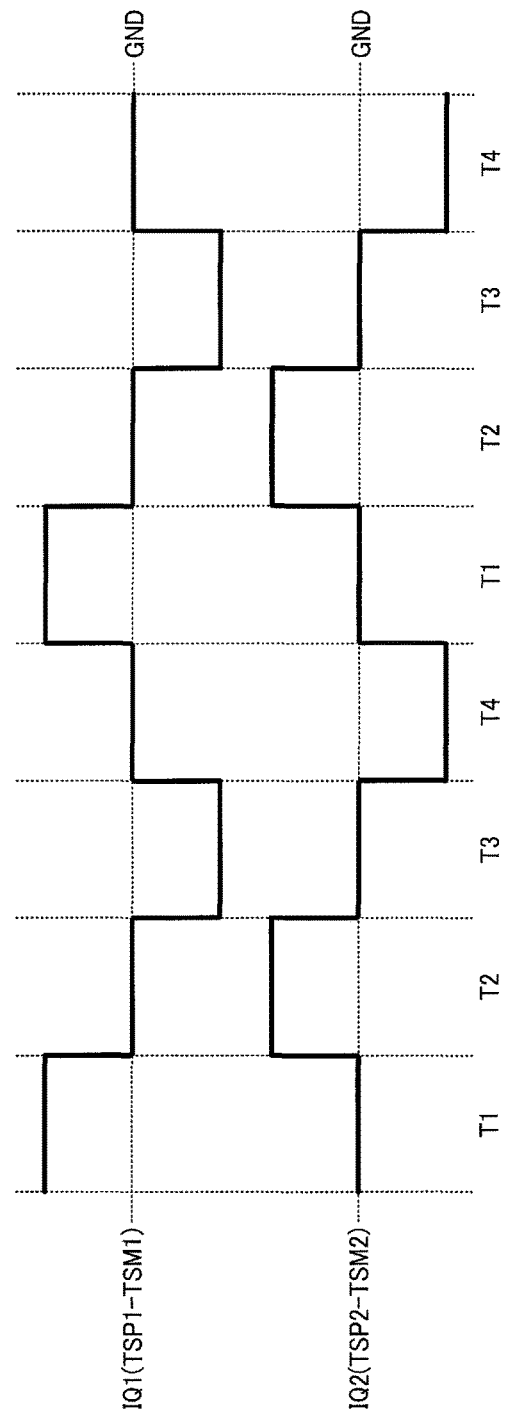

As shown in FIG. 10, the stepper motor completes one rotation through first to fourth steps T1 to T4 (first to fourth drive periods). As shown in FIG. 7, the drive current output by the first bridge circuit 10 is indicated by IQ1, and the drive current output by the second bridge circuit 12 is indicated by IQ2. In the first step T1, IQ1="+" (positive current value) and IQ2=0. As a result, a first pole MP1 serves as the N pole and thus attracts the S pole of a rotor RTR, and a second pole MP2 serves as the S pole and thus attracts the N pole of the rotor RTR. The rotation angle of the stepper motor is 0 degrees. In the second step T2, IQ1=0 and IQ2="+". As a result, a third pole MP3 serves as the N pole and thus attracts the S pole of the rotor RTR, and a fourth pole MP4 serves as the S pole and thus attracts the N pole of the rotor RTR. The rotation angle of the stepper motor is 90 degrees. In the third step T3, IQ1="−" (negative current value) and IQ2=0. As a result, the first pole MP1 serves as the S pole and thus attracts the N pole of the rotor RTR, and the second pole MP2 serves as the N pole and thus attracts the S pole of the rotor RTR. The rotation angle of the stepper motor is 180 degrees. In the fourth step T4, IQ1=0 and IQ2="−". As a result, the third pole MP3 serves as the S pole and thus attracts the N pole of the rotor RTR, and the fourth pole MP4 serves as the N pole and thus attracts the S pole of the rotor RTR. The rotation angle of the stepper motor is 270 degrees.

In the case where micro step driving is performed, the number of steps can be increased (the rotation angle in each step can be reduced) as compared to the single-phase driving by setting the ratio between the drive current IQ1 and the drive current IQ2 to a predetermined ratio. If, for example, the ratio between the drive current IQ1 and the drive current IQ2 is set to 1:1 (IQ1:IQ2=1:1) after the step T1, the S pole of the rotor RTR moves to a midpoint position between the first pole MP1 and the third pole MP3. If the same step is performed after the steps T2, T3 and T4, the stepper motor completes a single rotation through eight steps. In the micro step driving as well, the drive current IQ1 and the drive current IQ2 are changed periodically, as in the single-phase driving. As shown in FIG. 10, the drive current IQ1 and the drive current IQ2 have periodic waveforms that form one cycle through four steps, and the phase of the drive current IQ2 is delayed from the phase of the drive current IQ1 by 90 degrees. In the micro step driving as well, the drive current IQ1 and the drive current IQ2 are periodic waveforms that form one cycle through a predetermined number of steps (eight steps in the above-described example), and the phase of the drive current IQ2 is delayed from the phase of the drive current IQ1 by 90 degrees.

As described above, according to the present embodiment, the stepper motor is driven by using the first drive current IQ1 output from the first bridge circuit 10 and the second drive current IQ2 output from the second bridge circuit 12.

Then, in the case where the stepper motor completes one rotation through first to Nth periods (the first to fourth steps T1 to T4 in FIG. 10), the control circuit 20 controls the driving of the stepper motor by changing the first drive current IQ1 and the second drive current IQ2 when each of the first to Nth periods is switched, and periodically changing the first drive current IQ1 and the second drive current IQ2 by taking the first to Nth periods as one cycle.

At this time, as described in the comparative example shown in FIG. 1, if the switching timing is different between the first bridge circuit 10 and the second bridge circuit 12, the smoothness of rotation of the stepper motor may decrease. For example, the values of the drive currents IQ1 and IQ2 are changed when each step is switched, but if there is a difference in the switching timing between the first bridge circuit 10 and the second bridge circuit 12, the timings at which the drive currents IQ1, IQ2 are changed may become slightly different. Due to the difference, an unexpected force may be generated between the rotor RTR and the poles, preventing the rotor RTR from being smoothly rotated.

In this regard, according to the present embodiment, as described above with reference to FIG. 2, the signal lines extending from the pre-drivers to the bridge circuits have the same impedance between channels, and thus the first bridge circuit 10 and the second bridge circuit 12 have substantially the same switching timing, as a result of which it is expected that the stepper motor rotates smoothly.

10. Pre-Driver

Figure 11:
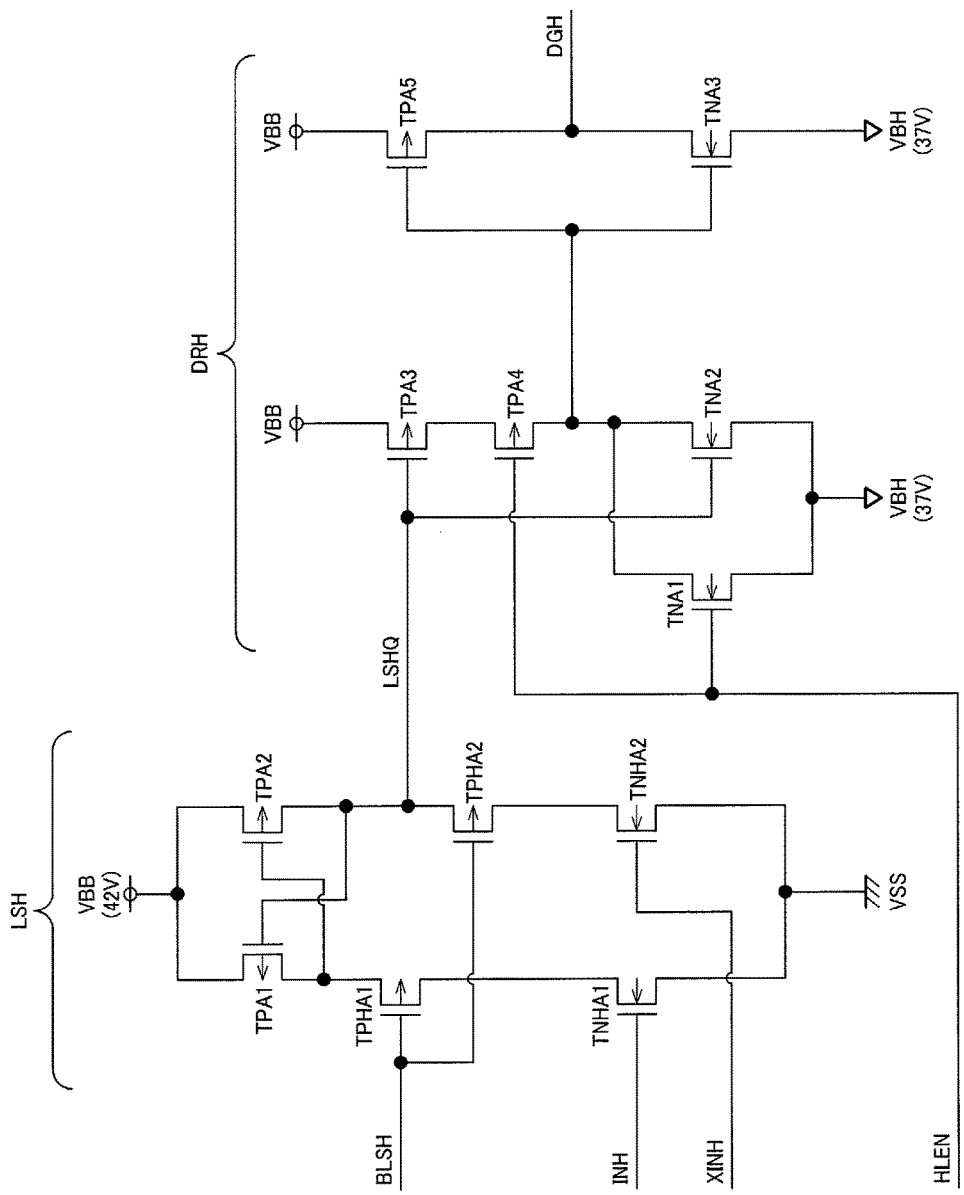
FIG. 11 shows an example of a detailed configuration of a driver circuit that drives high-side transistors.

Next is a description of a detailed circuit configuration of the pre-drivers. FIG. 11 shows an example of a detailed configuration of a driver circuit (PR1, PR3, PR5 and PR7 shown in FIG. 7) for driving the high-side transistors of the bridge circuit.

The driver circuit shown in FIG. 11 includes a level shifter unit LSH and a buffer unit DRH. The level shifter unit LSH includes P-type MOS transistors TPA1 and TPA2, P-type DMOS transistors TPHA1 and TPHA2, and N-type DMOS transistors TNHA1 and TNHA2. The buffer unit DRH includes P-type MOS transistors TPA3 to TPA5, and N-type MOS transistors TNA1 to TNA3.

The level shifter unit LSH level-shifts logic power supply control signals INH and XINH from the control circuit 20 to a power supply VBB signal LSHQ. The logic power supply is, for example, 3.3 V. The control signal XINH is a logical inverse of the control signal INH. The voltage levels of the signal LSHQ are VBB (42 V) and VBH (37 V), and the low level voltage VBH is achieved by setting a bias voltage BLSH as appropriate. Because the signal LSHQ has the low level VBH (37 V), it is sufficient that the transistors TPA1 and TPA2 have a breakdown voltage of 5 V, and thus they are formed by MOS transistors having a normal breakdown voltage. The transistors TPHA1, TPHA2, TNHA1 and TNHA2 are formed by DMOS transistors having a high breakdown voltage (a breakdown voltage of 42 V).

The buffer unit DRH buffers the output signal LSHQ output from the level shifter unit LSH, and outputs a drive signal DGH to the high-side transistors of the bridge circuit. A signal HLEN is an enable signal supplied from the control circuit 20. If the enable signal HLEN is enabled (low level), the buffer unit DRH performs buffering of the signal LSHQ. If the enable signal HLEN is disabled (high level), the buffer unit DRH fixes the drive signal DGH to a high level. At this time, the high-side (P-type) transistors of the bridge circuit are turned off. The power supply of the buffer unit DRH is VBB (42 V) and VBH (37 V), and thus the voltage levels of the drive signal DGH are VBB (42 V) and VBH (37 V). It is sufficient that the transistors TPA3 to TPA5 and TNA1 to TNA3 have a breakdown voltage of 5 V, and thus they are formed by MOS transistors having a normal breakdown voltage.

Figure 12:
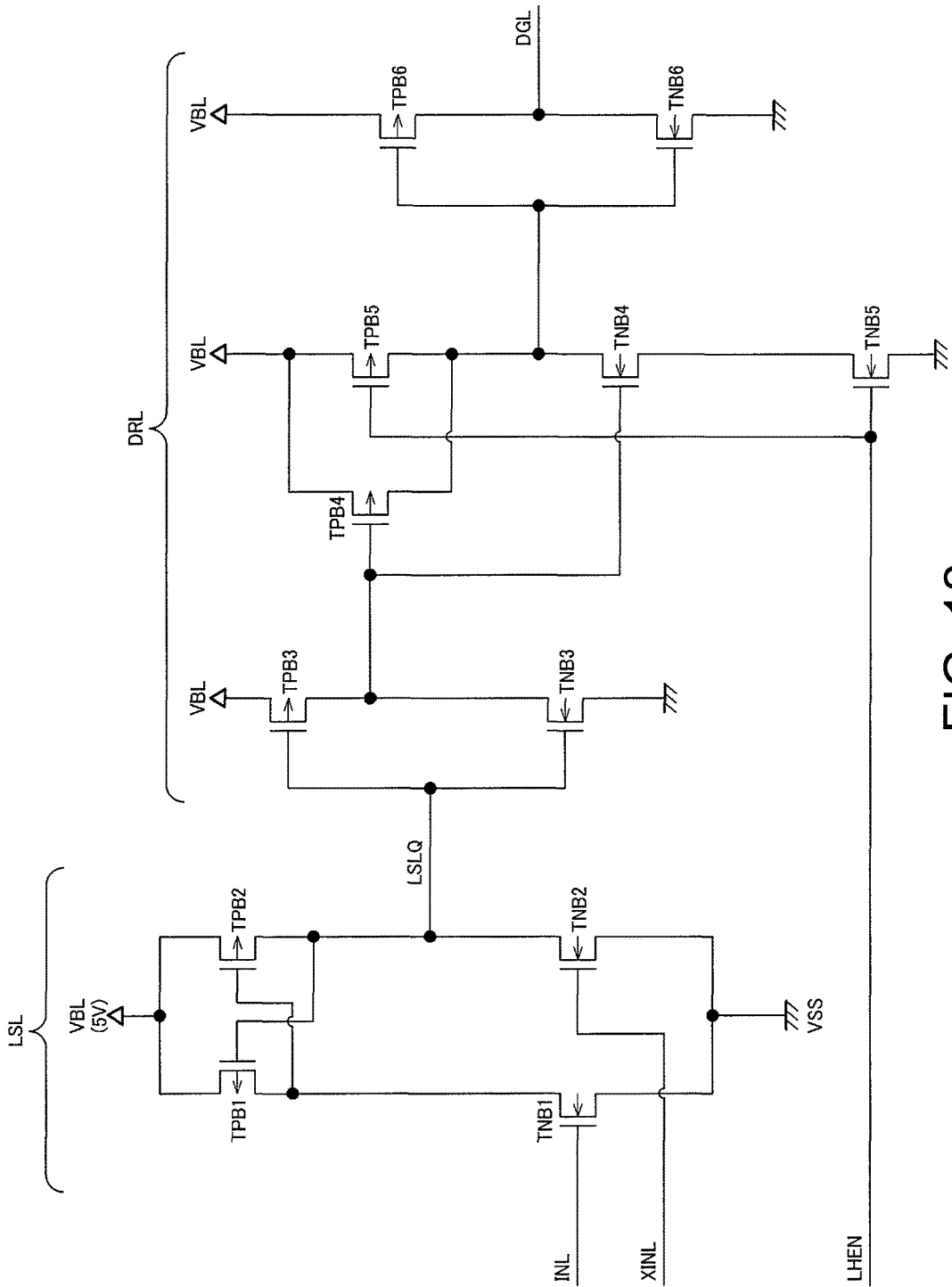
FIG. 12 shows an example of a detailed configuration of a driver circuit that drives low-side transistors.

FIG. 12 shows an example of a detailed configuration of a driver circuit (PR2, PR4, PR6 and PR8 shown in FIG. 7) for driving the low-side transistors of the bridge circuit.

The driver circuit shown in FIG. 12 includes a level shifter unit LSL and a buffer unit DRL. The level shifter unit LSL includes P-type MOS transistors TPB1 and TPB2, and N-type MOS transistors TNB1 and TNB2. The buffer unit DRL includes P-type MOS transistors TPB3 to TPB6, and N-type MOS transistors TNB3 to TNB6.

The level shifter unit LSL level-shifts logic power supply control signals INL and XINL from the control circuit 20 to a signal LSLQ for the power supply VBB. The control signal XINL is a logical inverse of the control signal INL. The voltage levels of the control signals INL and XINL are logic power supply (3.3 V) and VSS (0 V), and the voltage levels of the signal LSLQ are VBL (5 V) and VSS (0 V). Accordingly, the transistors TPB1, TPB2, TNB1 and TNB2 are formed by MOS transistors having a normal breakdown voltage.

The buffer unit DRL buffers the output signal LSLQ output from the level shifter unit LSL, and outputs a drive signal DGL to the low-side transistors of the bridge circuit. A signal LHEN is an enable signal supplied from the control circuit 20. If the enable signal LHEN is enabled (high level), the buffer unit DRL performs buffering of the signal LSLQ. If the enable signal LHEN is disabled (low level), the buffer unit DRL fixes the drive signal DGL to a low level. At this time, the low-side (N-type) transistors of the bridge circuit are turned off. The power supply of the buffer unit DRL is VBL (5 V) and VSS (0 V), and the voltage levels of the drive signal DGL are VBL (5 V) and VSS (0 V). It is sufficient that the transistors TPB3 to TPB6 and TNB3 to TNB6 have a breakdown voltage of 5 V, and thus they are formed by MOS transistors having a normal breakdown voltage.

11. Electronic Appliance

Figure 13:
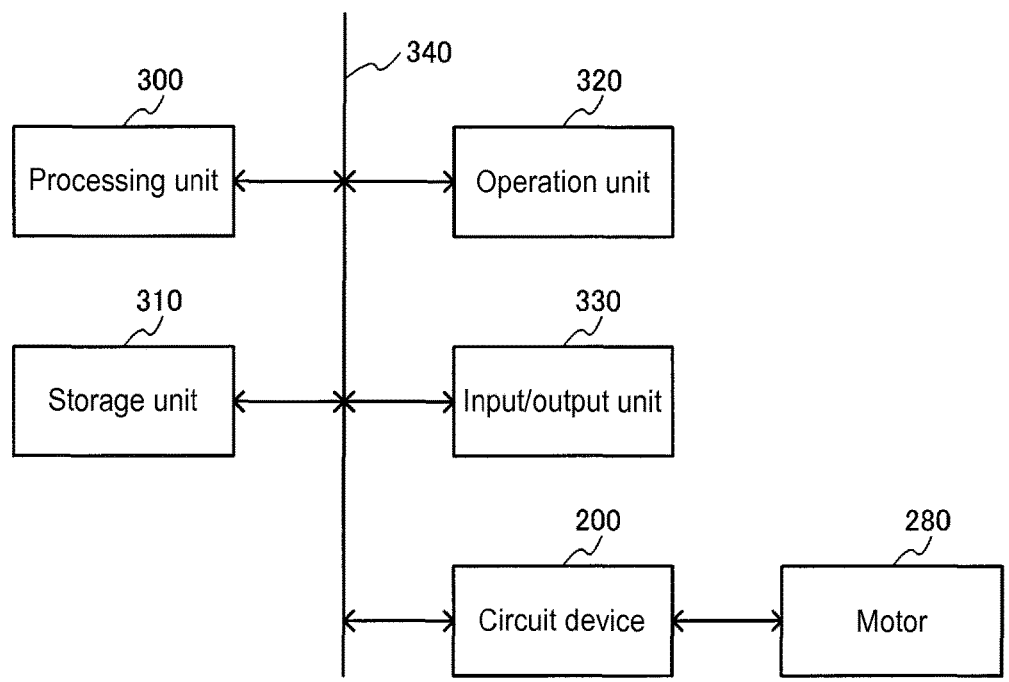
FIG. 13 shows an example of a configuration of an electronic appliance.

FIG. 13 shows an example of a configuration of an electronic appliance in which an integrated circuit device (motor driver) 200 according to the present embodiment is used. The electronic appliance includes a processing unit 300, a storage unit 310, an operation unit 320, an input/output unit 330, the integrated circuit device 200, a bus 340 connecting the above units, and a motor 280. Hereinafter, a description will be given by taking a printer that controls its head and paper feed by motor driving as an example, but the present embodiment is not limited thereto, and may be applied to various types of electronic appliances.

The input/output unit 330 is formed by, for example, an interface such as a USB connector, a wireless LAN or the like, and receives an input of image data and document data. The input data is stored in the storage unit 310, which is an internal storage device such as, for example, DRAM. Upon receiving a print instruction from the operation unit 320, the processing unit 300 starts an operation of printing data stored in the storage unit 310. The processing unit 300 issues an instruction regarding the print layout of the data to the integrated circuit device (motor driver) 200, and the integrated circuit device 200 rotates the motor 280 based on the instruction so as to move the head and perform paper feeding.

Although the embodiment according to the invention has been described in detail above, those skilled in the art can easily recognize that many variations that do not substantially depart from the new matter and effects of the invention are possible. Accordingly, all such variations are included in the scope of the invention. For example, a term (object to be driven, step, P-type, N-type or the like) described together with a different term (object to be driven, period, first conductivity type, second conductivity type or the like) having a broader meaning or the same meaning at least once in the specification or drawings may be replaced by the different term in anywhere in the specification or drawings. In addition, all combinations of the present embodiment and variations are also included in the scope of the invention. Furthermore, the configuration, operations and layout configurations of the integrated circuit device and the structures of the transistors and the guard regions are not limited to those described in the present embodiment, and various variations can be made.

This application claims priority from Japanese Patent Application No. 2014-174234 filed in the Japanese Patent Office on Aug. 28, 2014 the entire disclosure of which is hereby incorporated by reference in its entirely.

What is claimed is:

1. An integrated circuit device comprising:
   a first bridge circuit that is placed in a first region on a first direction side of a reference line in plan view of a substrate of the integrated circuit device, the first direction side being located in a first direction from the reference line;
   a second bridge circuit that is placed in a second region on a second direction side that is located in a second direction from the reference line, the second direction being opposite to the first direction with respect to the reference line in the plan view;
   a first pre-driver that drives the first bridge circuit and is placed on a third direction side of the first bridge circuit, the third direction side being located in a third direction from the reference line, the third direction being defined as being a direction that intersects the first direction and the second direction;
   a second pre-driver that drives the second bridge circuit;
   an analog circuit that is disposed on a side of the first and second pre-drivers that is opposite of the first and second bridge circuits so that the first and second pre-drivers are in between the analog circuit and the first and second bridge circuits and so that the analog circuit is farther from each of the first and second bridge circuits than the first and second pre-drivers to reduce noise from the first and second bridge circuits to the analog circuit relative to noise received by the first and second pre-drivers; and
   a guard region that is provided between the first and second bridge circuits and the first and second pre-drivers, and that sets the substrate of the integrated circuit device to have a substrate potential,
   wherein
   a signal line connecting the first pre-driver and the first bridge circuit and a signal line connecting the second pre-driver and the second bridge circuit are provided on the guard region,
   the first pre-driver is placed in the first region, and
   the second pre-driver is placed in the second region.

2. The integrated circuit device according to claim 1, wherein
the second pre-driver is placed on the third direction side of the second bridge circuit,
a first interconnect region is provided between the first pre-driver and the first bridge circuit, the first interconnect region being where a signal line connecting the first pre-driver and the first bridge circuit is provided, and
a second interconnect region is provided between the second pre-driver and the second bridge circuit, the second interconnect region being where a signal line connecting the second pre-driver and the second bridge circuit is provided.

3. The integrated circuit device according to claim 1, wherein the first bridge circuit includes:
a high-side first transistor;
a low-side second transistor;
a high-side third transistor; and
a low-side fourth transistor,
the first pre-driver includes:
first to fourth driver circuits that drive the first to fourth transistors,
in the first region, the first driver circuit and the third driver circuit are placed on the first direction side of the second driver circuit and the fourth driver circuit,
the second bridge circuit includes:
a high-side fifth transistor;
a low-side sixth transistor;
a high-side seventh transistor; and
a low-side eighth transistor,
the second pre-driver includes:
fifth to eighth driver circuits that drive the fifth to eighth transistors, and in the second region, the fifth driver circuit and the seventh driver circuit are placed on the second direction side of the sixth driver circuit and the eighth driver circuit.

4. The integrated circuit device according to claim 3, wherein a signal line extending from the second driver circuit to the second transistor and a signal line extending from the fourth driver circuit to the fourth transistor are provided in a region between the first transistor and the third transistor, and
a signal line extending from the sixth driver circuit to the sixth transistor and a signal line extending from the eighth driver circuit to the eighth transistor are provided in a region between the fifth transistor and the seventh transistor.

5. The integrated circuit device according to claim 3, among transistors constituting the first driver circuit and the third driver circuit, a transistor having a first breakdown voltage and a transistor having a second breakdown voltage that is higher than the first breakdown are placed so as to extend along the first direction in the first region, and
among transistors constituting the fifth driver circuit and the seventh driver circuit, a transistor having the first breakdown voltage and a transistor having the second breakdown voltage are placed so as to extend along the second direction in the second region.

6. The integrated circuit device according to claim 1, comprising a bias circuit that is placed between the first pre-driver and the second pre-driver, and that supplies a bias voltage to the first pre-driver and the second pre-driver.

7. The integrated circuit device according to claim 1, wherein the first bridge circuit and the second bridge circuit include a high-side transistor and a low-side transistor that are DMOS transistors, and
the guard region includes:
a buried layer of first conductivity type that is formed in the substrate of first conductivity type;
a well of first conductivity type that is formed above the buried layer of first conductivity type; and
an impurity layer of first conductivity type that is formed above the well of first conductivity type.

8. The integrated circuit device according to claim 1, wherein terminal nodes between terminals and transistors constituting the first bridge circuit and the second bridge circuit are formed by an uppermost interconnect layer serving as a pad interconnect, and
the signal line connecting the first pre-driver and the first bridge circuit and the signal line connecting the second pre-driver and the second bridge circuit are formed by a lower interconnect layer that is provided at a position lower than the uppermost interconnect layer.

9. The integrated circuit device according to claim 1, wherein the integrated circuit device drives a stepper motor by using a first drive current output from the first bridge circuit and a second drive current output from the second bridge circuit.

10. The integrated circuit device according to claim 9, comprising:
a control circuit that controls the first bridge circuit and the second bridge circuit,
wherein if the stepper motor completes one rotation through first to Nth periods, the control circuit controls driving of the stepper motor by changing the first drive current and the second drive current when each of the first to the Nth periods is switched, and periodically changing the first drive current and the second drive current by taking the first to the Nth periods as one cycle.

11. An electronic appliance comprising the integrated circuit device according to claim 1.

12. An integrated circuit device comprising:
a first bridge circuit that is placed in a first direction side of a reference line in plan view of a substrate of the integrated circuit device, the reference line is a straight line on a parallel with one side of the integrated circuit device, the first direction side being located in a first direction from the reference line;
a second bridge circuit that is placed in a second direction side that is located in a second direction from the reference line, the second direction being opposite to the first direction with respect to the reference line in the plan view;
a first pre-driver that drives the first bridge circuit and is placed in the first direction side of the reference line in the plan view and is placed on a third direction side of the first bridge circuit, the third direction being located in a third direction from the reference line, the third direction being defined as being a direction that intersects the first direction and the second direction;
a second pre-driver that drives the second bridge circuit and is placed in the second direction side of the reference line in the plan view; and
an analog circuit that is disposed on a side of the first and second pre-drivers that is opposite of the first and second bridge circuits so that the first and second pre-drivers are in between the analog circuit and the first and second bridge circuits and so that the analog circuit is farther from each of the first and second bridge circuits than the first and second pre-drivers to reduce noise from the first and second bridge circuits to the analog circuit relative to noise received by the first and second pre-drivers; and a guard region that is provided between the first and second bridge circuits and the first and second pre-drivers, and that sets the substrate of the integrated circuit device to have a substrate potential, wherein a signal line connecting the first pre-driver and the first bridge circuit and a signal line connecting the second pre-driver and the second bridge circuit are provided on the guard region.

13. The integrated circuit device according to claim 1, wherein the first and second pre-drivers and the first and second bridge circuits are formed on the same substrate, and the guard region is an impurity region formed in the substrate.

14. The integrated circuit device according to claim 1, further comprising:

a first signal line that electrically connects the first pre-driver and a first high-side bridge circuit is located in the first direction of a second signal line that electrically connects the first pre-driver and a first low-side bridge circuit; and a third signal line that electrically connects the second pre-driver and a second high-side bridge circuit is located in the second direction of a forth signal line that electrically connects the second pre-driver and a second low-side bridge circuit.

15. The integrated circuit device according to claim 14, wherein:

the first signal line and the third signal line are arranged at substantially equal distances from the reference line, and the second signal line and the fourth signal line are disposed at substantially equal distances from the reference line.

* * * * *